United States Patent
Chan-Park et al.

(10) Patent No.: US 6,906,779 B2
(45) Date of Patent: Jun. 14, 2005

(54) PROCESS FOR ROLL-TO-ROLL MANUFACTURE OF A DISPLAY BY SYNCHRONIZED PHOTOLITHOGRAPHIC EXPOSURE ON A SUBSTRATE WEB

(75) Inventors: Mary Chan-Park, Fremont, CA (US); Xianhai Chen, Fremont, CA (US); Zarng-Arh George Wu, San Jose, CA (US); Xiaojia Wang, Fremont, CA (US); Hong-Mei Zang, Sunnyvale, CA (US); Rong-Chang Liang, Sunnyvale, CA (US)

(73) Assignee: SiPix Imaging, Inc., Fremont, CA (US)

( * ) Notice: Subject to any disclaimer, the term of this patent is extended or adjusted under 35 U.S.C. 154(b) by 0 days.

(21) Appl. No.: 10/366,813

(22) Filed: Feb. 13, 2003

(65) Prior Publication Data

US 2003/0152849 A1 Aug. 14, 2003

Related U.S. Application Data

(62) Division of application No. 09/784,972, filed on Feb. 15, 2001.

(51) Int. Cl.[7] .................. G03B 27/48; G03B 27/54; G03B 27/62
(52) U.S. Cl. ............................ 355/50; 67/75
(58) Field of Search ................ 355/402, 403, 355/404, 47, 50, 53, 67, 72, 75; 204/453, 485, 486, 487; 430/311–329

(56) References Cited

U.S. PATENT DOCUMENTS

| 3,668,106 A | 6/1972 | Ota |
| 3,892,568 A | 7/1975 | Ota et al. |

(Continued)

FOREIGN PATENT DOCUMENTS

| CA | 2340683 | 2/2001 |

(Continued)

OTHER PUBLICATIONS

Bryning et al., "37.4: Reverse–Emulsion Electrophoretic Display (Reed)" *SID 98 Digest* pp. 1018–1021 (1998).

(Continued)

*Primary Examiner*—Alan Mathews
(74) *Attorney, Agent, or Firm*—Howrey Simon Arnold & White, LLP

(57) ABSTRACT

This invention relates to an electrophoretic display or a liquid crystal display and novel processes for its manufacture. The electrophoretic display (EPD) of the present invention comprises microcups of well-defined shape, size and aspect ratio and the microcups are filled with charged pigment particles dispersed in an optically contrasting dielectric solvent. The liquid crystal display (LCD) of this invention comprises well-defined microcups filled with at least a liquid crystal composition having its ordinary refractive index matched to that of the isotropic cup material. A novel roll-to-roll process and apparatus of the invention permits the display manufacture to be carried out continuously by a synchronized photo-lithographic process. The synchronized roll-to-roll process and apparatus permits a pre-patterned photomask, formed as a continuous loop, to be rolled in a synchronized motion in close parallel alignment to a web which has been pre-coated with a radiation sensitive material, so as to maintain image alignment during exposure to a radiation source. The radiation sensitive material may be a radiation curable material, in which the exposed and cured portions form the microcup structure. In an additional process step, the radiation sensitive material may be a positively working photoresist which temporarily seals the microcups. Exposure of a selected subset of the microcups via the photomask image permits selective re-opening, filling and sealing of the microcup subset. Repetition with additional colors permits the continuous assembly of a multicolor EPD or LCD display.

9 Claims, 12 Drawing Sheets

U.S. PATENT DOCUMENTS

| | | | |
|---|---|---|---|
| 4,071,430 | A | 1/1978 | Liebert |
| 4,093,534 | A | 6/1978 | Carter et al. |
| 4,285,801 | A | 8/1981 | Chiang |
| 4,655,897 | A | 4/1987 | Disanto et al. |
| 4,680,103 | A | 7/1987 | Beilin Solomon I. et al. |
| 5,177,476 | A | 1/1993 | Disanto et al. |
| 5,380,362 | A | 1/1995 | Schubert |
| 5,403,518 | A | 4/1995 | Schubert |
| 5,460,688 | A | 10/1995 | Disanto et al. |
| 5,480,938 | A | 1/1996 | Badesha et al. |
| 5,573,711 | A | 11/1996 | Hou et al. |
| 5,872,552 | A | 2/1999 | Gordon, II et al. |
| 5,914,806 | A | 6/1999 | Gordon II et al. |
| 5,930,026 | A | 7/1999 | Jacobson et al. |
| 5,943,113 | A | 8/1999 | Ichihashi |
| 5,961,804 | A | 10/1999 | Jacobson et al. |
| 5,967,871 | A | 10/1999 | Kaake et al. |
| 5,978,062 | A | 11/1999 | Liang et al. |
| 6,017,584 | A | 1/2000 | Albert et al. |
| 6,018,383 | A * | 1/2000 | Dunn et al. .................. 355/49 |
| 6,319,381 | B1 * | 11/2001 | Nemelka .................... 204/485 |
| 6,524,153 | B1 | 2/2003 | Ikeda et al. |
| 6,652,075 | B2 | 11/2003 | Jacobson |
| 2001/0009352 | A1 | 7/2001 | Moore |
| 2002/0018043 | A1 | 2/2002 | Nakanishi |
| 2002/0029969 | A1 * | 3/2002 | Yager et al. ................ 204/455 |
| 2002/0182544 | A1 | 12/2002 | Chan-Park et al. |
| 2002/0188053 | A1 | 12/2002 | Zang et al. |
| 2002/0196525 | A1 | 12/2002 | Chen et al. |

FOREIGN PATENT DOCUMENTS

| | | |
|---|---|---|
| DE | 199 27 359.6 | 12/2000 |
| EP | 1195603 | 4/2002 |
| JP | 59-034518 | 2/1984 |
| JP | 62-099727 | 5/1987 |
| JP | 62-203123 | 9/1987 |
| JP | 01-300232 | 12/1989 |
| JP | 02-223936 | 9/1990 |
| JP | 02284126 | 11/1990 |
| JP | 04-113386 | 4/1992 |
| JP | 09-160052 | 6/1997 |
| JP | 2000-241648 | 9/2000 |
| JP | 2001-056653 | 2/2001 |
| WO | WO 97/04398 | 2/1997 |
| WO | WO 99/53373 | 10/1999 |
| WO | WO 00/77571 | 12/2000 |
| WO | WO 01/67170 A1 | 9/2001 |

OTHER PUBLICATIONS

Inoue, S. et al., "High Resolution Microencapsulated Electrophoretic Display (EPD) Driven by Poly–Si TFTs With Four–Level Grayscale" *IEEE Transactions on Electron Devices* 49(8), pp. 1532–1539 (2002).

Kazlas, P. et al., "12.1: 12.1" SVGA Microencapsulated Electorphoretic Active Matrix Display for Information Applicances *SID 01 Digest* 152–155 (2001).

Kishi, E et al, "5.1 Development of In–Plane EPD", Canon Research Center, SID 00 Digest, pp–24–27.

Matsuda Y. "Newly designed, high resolution, active matrix addressing in plane EPD" *IDW 02 EP2–3* 1341–1344 (2002).

Ota et al., "Developments in Electrophoretic Displays" *Proc. of SID*. vol. 18/3&4, pp–243–254 (1977).

Swanson et al., "5.2: High Performance Electrophoretic Displays" *SID 00 Diges*, pp–29–31 (2000).

Liang, R.C., <<Microcup(R) Electrophoretic and Liquid Crystal Displays by Roll–to–Roll Manufacturing Processes>>, USDC Flexible Microelectronics & Displays Conference, Feb. 3–4, 2003, Phoenix, Arizona, USA.

Liang, R.C. et al, <<Microcup Electrophoretic Displays by Roll–to–Roll Manufacturing Processes>>, IDW '02, Dec. 4–6, pp1337–1340.

Liang, R. C et al., "Microcup Electrophoretic Displays by Roll–to–Roll Manufacturing Processes" *Proc. of the IDW'02*, International Conference Center Hiroshima (Dec. 4–6, 2002).

Liang, R.C., "Microcup® Electrophoretic and Liquid Crystal Displays by Roll–to–Roll Manufacturing Process" *USDC Flexible Microelectronics & Displays Conference* Phoenix, AZ (Feb. 3–4, 2003).

Matsuda Y. "Newly designed, high resolution, active matrix addressing in plane EPD" *IDW 02 EP2–3* 1341–1344 (2002).

Ota et al. "Developments in Electrophoretic Displays"*Proc. of SID* 18:243–254 (1977).

Swanson et al., "High Performance Electrophoretic Displays" *SID 00 Digest* 29–31 (2000).

Dalisa, A.L., "Electrophoretic Display Technology", *IEEE Trans. Electr. Dev.*—24:827–834 (1977).

Hopper, M.A., et al., "An Electrophoretic Display, its Properties, Model, and Addressing", *IEEE Trans Electr. Dev.* 26(8):1148–1152 (1979).

Murau, P., et al., "The understanding and elimination of some suspension instabilities in an electrophoretic display", *J. Appl. Phys.*—49(9):4820–4829 (1978).

Singer, B., "An X–Y Addressable Electrophoretic Display", *Proc. SID*—18(3/4):255–266 (1977).

* cited by examiner

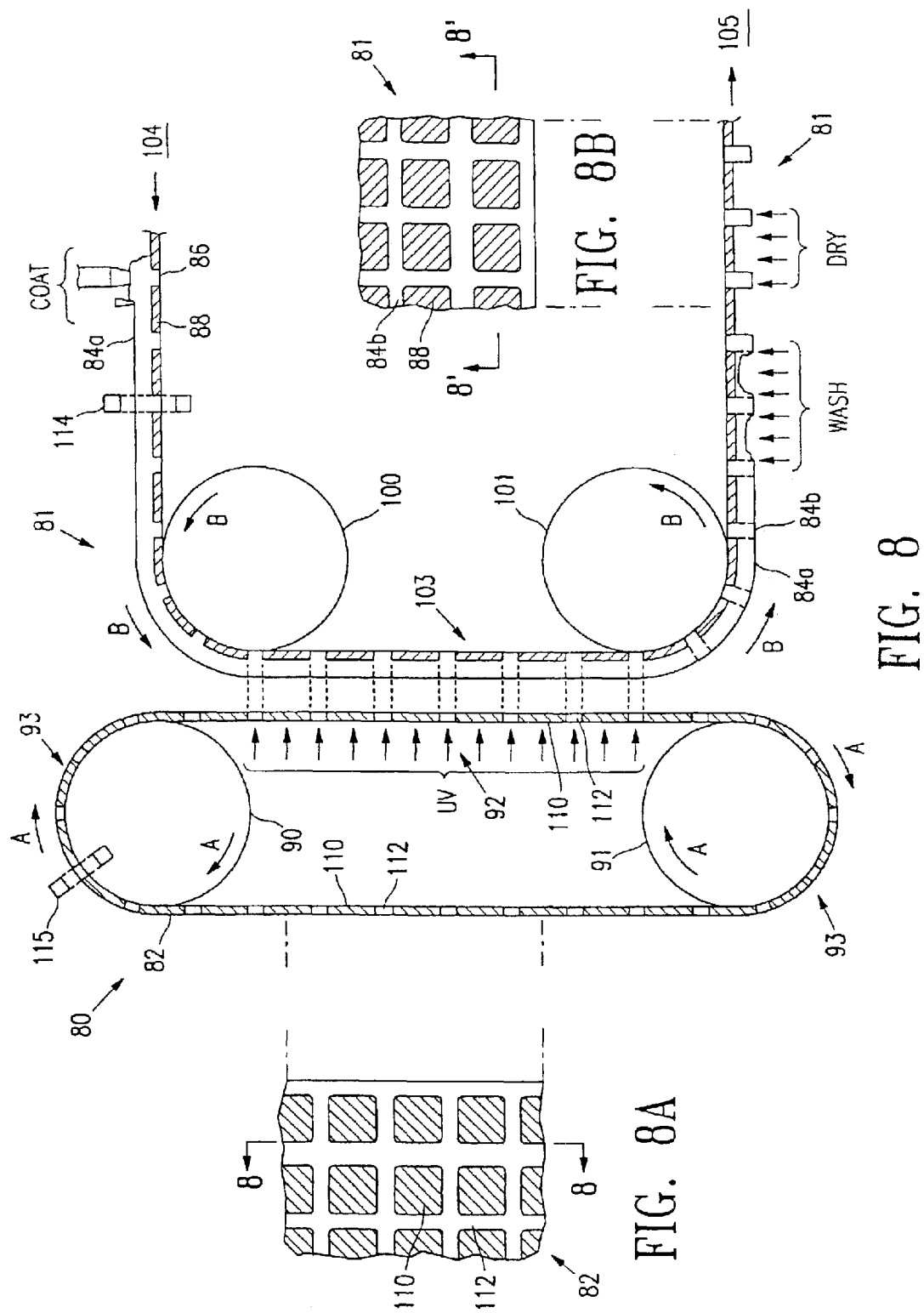

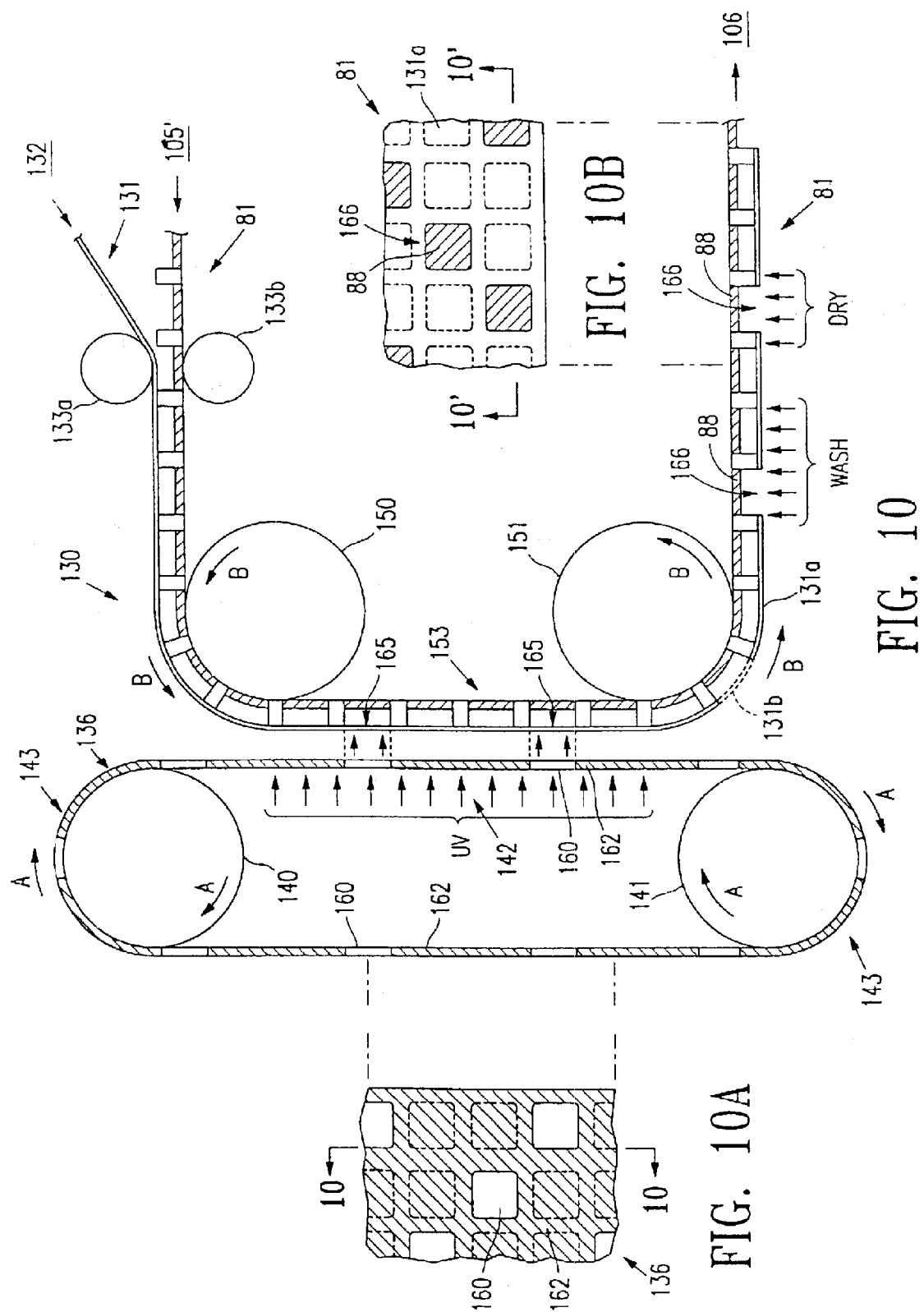

PROCESS FOR ROLL-TO-ROLL MANUFACTURE OF A DISPLAY BY SYNCHRONIZED PHOTOLITHOGRAPHIC EXPOSURE ON A SUBSTRATE WEB

CROSS REFERENCE TO RELATED APPLICATIONS

This application is a divisional of, and claims the benefit under 35 USC 120 and 121, of U.S. patent application Ser. No. 09/784,972, filed Feb. 15, 2001, the entire disclosure of which is incorporated herein by reference.

DESCRIPTION

This application is one of series of our co-pending applications by the same inventive entity pertaining to novel electrophoretic and LCD image displays and subassemblies, and to novel methods of making such displays and subassemblies. Certain of the inventions which are disclosed in these related applications are also disclosed in the present application. The absence of claims in the present application directed to any particular inventive subject matter disclosed herein is not to be construed as intent by Applicants to forego patent protection as to such subject matter.

FIELD

This invention relates to the field of electrophoretic displays, and more particularly to methods and processes for the manufacture of such displays comprising cells of well-defined shape, size, and aspect ratio, which cells are filled with charged pigment particles dispersed in a solvent. The processes disclosed include the roll-to-roll manufacture of an electrophoretic display by synchronized photolithographic exposure on a substrate web.

BACKGROUND

The electrophoretic display is a non-emissive device based on the electrophoresis phenomenon influencing charged pigment particles suspended in a solvent. This general type of display was first proposed in 1969. An electrophoretic display typically comprises a pair of opposed, spaced-apart plate-like electrodes, with spacers predetermining a certain distance between the electrodes. One of the electrodes is typically transparent. A suspension composed of a colored solvent and suspended charged pigment particles is enclosed between the two plates.

When a voltage difference is imposed between the two electrodes, the pigment particles migrate to one side by attraction to the plate of polarity opposite that of the pigment particles. Thus the color showing at the transparent plate may be determined by selectively charging the plates to be either the color of the solvent or the color of the pigment particles. Reversal of plate polarity will cause the particles to migrate back to the opposite plate, thereby reversing the color. Intermediate color density (or shades of grey) due to intermediate pigment density at the transparent plate may be obtained by controlling the plate charge through a range of voltages.

Among the advantages of an electrophoretic display (EPD) over other types of flat panel displays is the very low power consumption. This salient advantage makes the EPD particularly suitable for portable and battery powered devices such as laptops, cell phones, personal digital assistants, portable electronic medical and diagnostic devices, global positioning system devices, and the like.

In order to prevent undesired movements of the particles such as sedimentation, partitions were proposed between the two electrodes for dividing the space into smaller cells. See, e.g., M. A Hopper and V. Novotny, IEEE Trans. Electr. Dev., Vol ED 26, No. 8, pp 1148–1152 (1979). However, in the case of the partition-type electrophoretic display, some difficulties are encountered in the formation of the partitions and the process of enclosing the suspension. Furthermore, it is also difficult to keep different colors of suspensions separate from each other in the partition-type electrophoretic display.

Attempts have been made to enclose the suspension in microcapsules. U.S. Pat. Nos. 5,961,804 and 5,930,026 describe microencapsulated electrophoretic displays. These displays have a substantially two dimensional arrangement of microcapsules each having therein an electrophoretic composition of a dielectric fluid and a suspension of charged pigment particles that visually contrast with the dielectric solvent. The microcapsules can be formed by interfacial polymerization, in-situ polymerization or other known methods such as physical processes, in-liquid curing or simple/complex coacervation. The microcapsules, after their formation, may be injected into a cell housing two spaced-apart electrodes, or they may be "printed" into or coated on a transparent conductor film. The microcapsules may also be immobilized within a transparent matrix or binder that is itself sandwiched between the two electrodes.

The electrophoretic displays prepared by these prior art processes, in particular the microencapsulation process, as disclosed in U.S. Pat. Nos. 5,930,026, 5,961,804, and 6,017,584, have several shortcomings. For example, the electrophoretic displays manufactured by the microencapsulation process suffer from sensitivity to environmental changes (in particular sensitivity to moisture and temperature) due to the wall chemistry of the microcapsules. Secondly the electrophoretic displays based on the microcapsules have poor scratch resistance due to the thin wall and large particle size of the microcapsules. To improve the handleability of the display, microcapsules are embedded in a large quantity of polymer matrix which results in a slow response time due to the large distance between the two electrodes and a low contrast ratio due to the low payload of pigment particles. It is also difficult to increase the surface charge density on the pigment particles because charge-controlling agents tend to diffuse to the water/oil interface during the microencapsulation process. The low charge density or zeta potential of the pigment particles in the microcapsules also results in a slow response rate. Furthermore, because of the large particle size and broad size distribution of the microcapsules, the prior art electrophoretic display of this type has poor resolution and addressability for color applications.

SUMMARY

The electrophoretic display (EPD) of the present invention comprises cells of well-defined shape, size and aspect ratio and the cells are filled with charged pigment particles dispersed in an optically contrasting dielectric solvent.

The invention also relates to a novel roll-to-roll process and apparatus which permit the manufacture of the display to be carried out continuously by a synchronized photolithographic process. The synchronized roll-to-roll process and apparatus are also useful for manufacturing liquid crystal displays (LCD) and other structures and assemblies for electronic devices.

One embodiment of the invention relates to the manufacture of a plurality of microcups which are formed integrally with one another as portions of a structured two-dimensional array assembly, preferably being formed upon a support web including a patterned conductor film, such as addressable indium-tin oxide (ITO) lines. Each microcup of the array assembly is filled with a suspension or dispersion of charged pigment particles in a dielectric solvent, and sealed to form an electrophoretic cell.

The substrate web upon which the microcups are formed preferably includes a display addressing array comprising pre-formed conductor film, such as ITO conductor lines. The conductor film (ITO lines) and support web are coated with a radiation curable polymer precursor layer. The film and precursor layer are then exposed imagewise (as defined below) to radiation to form the microcup wall structure. Following exposure, the precursor material is removed from the unexposed areas, leaving the cured microcup walls bonded to the conductor film/support web. The imagewise exposure may be by UV or other forms of radiation through a photomask to produce an image or predetermined pattern of exposure of the radiation curable material coated on the conductor film. Although it is generally not required, the mask may be positioned and aligned with respect to the conductor film, i.e., ITO lines, so that the transparent mask portions align with the spaces between ITO lines, and the opaque mask portions align with the ITO material (intended for microcup cell floor areas).

Alternatively, the microcup array may be prepared by a process including embossing a thermoplastic or thermoset precursor layer coated on a conductor film with a pre-patterned male mold, followed by releasing the mold. The precursor layer may be hardened by radiation, cooling, solvent evaporation, or other means. This novel micro-embossing method is included in the subject of our co-pending application entitled "An Improved Electrophoretic Display and Novel Process for Its Manufacture", U.S. patent application Ser. No. 09/518,488, filed Mar. 4, 2000.

Solvent-resistant, thermomechanically stable microcups having a wide range of size, shape, and opening ratio can be prepared by either one of the aforesaid methods.

Another embodiment of the invention relates to the manufacture of a monochrome electrophoretic display from a microcup assembly by filling the microcups with a single pigment suspension composition, sealing the microcups, and finally laminating the sealed array of microcups with a second conductor film pre-coated with an adhesive layer.

A further embodiment of the invention relates to the manufacture of a color electrophoretic display from a microcup assembly by a process of sequential selective opening and filling of predetermined microcup subsets. The process includes laminating or coating the pre-formed microcups with a layer of positively-working photoresist, selectively opening a certain number of the microcups by imagewise exposing the positive photoresist, followed by developing the resist, filling the opened cups with a colored electrophoretic fluid, and sealing the filled microcups by a sealing process. These steps may be repeated to create sealed microcups filled with electrophoretic fluids of different colors. Thus, the array may be filled with different colored compositions in predetermined areas to form a color electrophoretic display. Various known pigments and dyes provide a wide range of color options for both solvent phase and suspended particles. Known fluid application and filling mechanisms may be employed.

Yet a further embodiment of the invention relates to a synchronized roll-to-roll photolithographic exposure method and apparatus, which may be employed for a number of useful processes, including the process of making the microcup array and the process of selectively filling the array of microcups to form a color display assembly. The imagewise roll-to-roll photolithographic exposure is preferably done through a moving photomask synchronized with a moving web substrate, to permit imagewise exposure of the workpiece (e.g., microcup array or color display) in a continuous and seamless manner.

The pre-patterned photomask may be an elongate strip formed as a continuous loop. The photomask pattern corresponds in form to structures of the microcup array or other subject device, such as the microcup walls and top openings. The photomask permits an image of the microcup array structure to be projected by radiation passing through the photomask. This "imagewise" exposure selectively exposes the radiation sensitive material to form the imaged structures while leaving the intervening material unexposed. The photomask loop is supported and aligned by an alignment mechanism so that the photomask loop is adjacent to the web, and a portion of the photomask loop is in generally parallel orientation to the portion of web to be exposed.

The synchronized motion of the photomask and web includes moving the portion of the photomask loop which is adjacent to the web in parallel to the web in the substantially same direction. In effect, the photomask loop is "rolled" in a synchronized motion relative to the web in close parallel proximity to the exposed web portion, so as to maintain image alignment during exposure. The relative motion of the web and photomask is controlled so that the microcup pattern of the mask remains aligned with the corresponding structures being "imaged" on the web during exposure. In a continuous synchronized motion and exposure process, the web and mask are moved at the same speed in the same direction during exposure in order to maintain this constant alignment.

Alternatively, a semi-continuous synchronized motion may be employed, whereby the mask and web are moved by equal incremental distances prior to exposure, but remain fixed during exposure.

For the roll-to-roll process, the photomask may be synchronized in motion with the support web using mechanisms such as coupling or feedback circuitry or common drives to maintain the coordinated motion (i.e., to move at the same speed).

For preparation of the array of discretely patterned microcups, the roll-to-roll photolithographic exposure apparatus can accept the conductor film/substrate web coated with radiation-curable composition as a continuous strip in a high speed process. Following exposure, the web moves into a development area where the unexposed material is removed to form the microcup wall structure. The microcups and ITO lines are preferably of selected size and coordinately aligned with the photomask, so that each completed display cell (i.e., filled and sealed microcup) may be discretely addressed and controlled by the display processor. The ITO lines may be pre-formed by either a wet or dry etching process on the substrate web.

For making color displays from the microcup array, the synchronized roll-to-roll exposure photolithographic process of the invention permits the selective opening, filling and sealing of pre-selected subsets of the microcup cells.

The pre-formed microcup array may be laminated or coated to temporarily seal the microcups with a positive-acting photoresist composition, and the sealed microcup array is then imagewise exposed (e.g., using a corresponding photomask) to selectively expose the top openings of a desired subset of the microcups. Known laminating and coating mechanisms may be employed. The exposed portion of the photoresist may then be removed by a developer to open the tops of the selected microcup subset. The term "developer" in this context refers to suitable known means for selectively removing the exposed photoresist, while leaving the unexposed photoresist in place.

Thus, the array may be sequentially filled with several different color compositions (typically three primary colors) in a pre-determined cell pattern. For example, the imagewise exposure process may employ a positively working photoresist top laminate which initially seals the empty microcups. The microcups are then exposed through a mask (e.g., a loop photomask in the described roll-to-roll process) so that only a first selected subset of microcups are exposed. Development with a developer removes the exposed photoresist and thus opens the first microcup subset to permit filling with a selected color pigment dispersion composition, and subsequent sealing by one of the methods described herein. The exposure and development process is repeated to expose and open a second selected microcup subset for filling with a second pigment dispersion composition, with subsequent sealing. Finally, the remaining photoresist is removed and the third subset of microcups is filled and sealed.

Yet another embodiment of the invention relates to the sealing of the microcups after they are filled with the electrophoretic fluid containing a dispersion of charged pigment particles in a dielectric fluid. Preferably, the sealing is accomplished by dispersing a thermoplastic or thermoset precursor in the electrophoretic fluid before the filling step. The thermoplastic or thermoset precursor is immiscible with the dielectric solvent and has a specific gravity lower than that of the solvent and the pigment particles. After filling, the thermoplastic or thermoset precursor phase separates from the electrophoretic fluid and forms a supernatant layer at the top of the fluid.

The sealing of the microcups is then conveniently accomplished by hardening the precursor layer by solvent evaporation, interfacial reaction, moisture, heat, or radiation. UV radiation is the preferred method to seal the microcups, although a combination of two or more curing mechanisms as described above may be used to increase the throughput of sealing. Alternatively, the sealing can be accomplished by overcoating the electrophoretic fluid with a solution containing the thermoplastic or thermoset precursor. To reduce or eliminate the degree of intermixing during the overcoating process, it is highly advantageous to use a sealing composition that is immiscible with the electrophoretic fluid and preferably has a specific gravity lower than the dielectric fluid. The sealing is then accomplished by hardening the precursor by solvent evaporation, interfacial reaction, moisture, heat, radiation, or a combination of curing mechanisms. These sealing processes are especially unique features of the present invention.

Liquid crystal displays may also be prepared by the method of this invention if the electrophoretic fluid described above is replaced by a suitable liquid crystal composition having the ordinary refractive index matched to that of the isotropic cup material. In the "on" state, the liquid crystal in the microcups is aligned to the field direction and is transparent. In the "off" state, the liquid crystal is not aligned and scatters light. To maximize the light scattering effect, the diameter of the microcups is typically in the range of 0.5–10 microns.

In summary, the roll-to-roll process of the present invention may be employed to carry out a sequence of processes on a single continuous web, by carrying and guiding the web to a plurality of process stations in sequence.

For example, the microcups may be formed, filled, sealed and laminated in a continuous sequence.

In addition to the formation and filling of microcup arrays, the synchronized roll-to-roll process may be adapted to the preparation of a wide range of structures or discrete patterns for electronic devices formable upon a support web substrate, e.g., flexible circuit boards and the like. As in the process and apparatus for EPD microcups described herein, a pre-patterned photomask is prepared which includes a plurality of photomask portions corresponding to structural elements of the subject device. Each such photomask portion may have a pre-selected transparency to radiation or a pre-selected opacity to radiation, so as to form an image of such structural elements upon the correspondingly aligned portion of the web during exposure. The methodology of the invention may be used for selective curing of structural material, or may be used to expose positively or negatively acting photoresist material during manufacturing processes.

Because these multiple-step processes as disclosed may be carried out roll-to-roll continuously or semi-continuously, they are suitable for high volume and low cost production. These processes are also efficient and inexpensive as compared to other processes for high volume production operations. The electrophoretic display prepared according to the present invention is not sensitive to environment, such as humidity and temperature. The display is thin, flexible, durable, easy-to-handle, and format-flexible. Since the electrophoretic display prepared according to the present invention comprises cells of favorable aspect ratio and well-defined shape and size, the bi-stable reflective display has excellent color addressability, high contrast ratio, and fast switching rate. Furthermore, the disclosed apparatus and methods of the invention are directed to electrophoretic displays (EPDs) suitable for economical mass production, thereby making the low power consumption characteristics of the EPD available to a broader range of consumer, scientific, commercial and industrial electronics.

BRIEF DESCRIPTION OF THE DRAWINGS

FIGS. 8, 8A and 8B show the method steps of FIGS. 5A–C carried out by a novel synchronized roll-to-roll photo-lithographic apparatus of the invention.

FIGS. 10, 10A and 10B show the method steps of FIGS. 9A–H carried out by the novel synchronized roll-to-roll photo-lithographic apparatus of the invention using a positive acting photoresist laminate or coating.

DETAILED DESCRIPTION OF THE INVENTION

Figure 1:
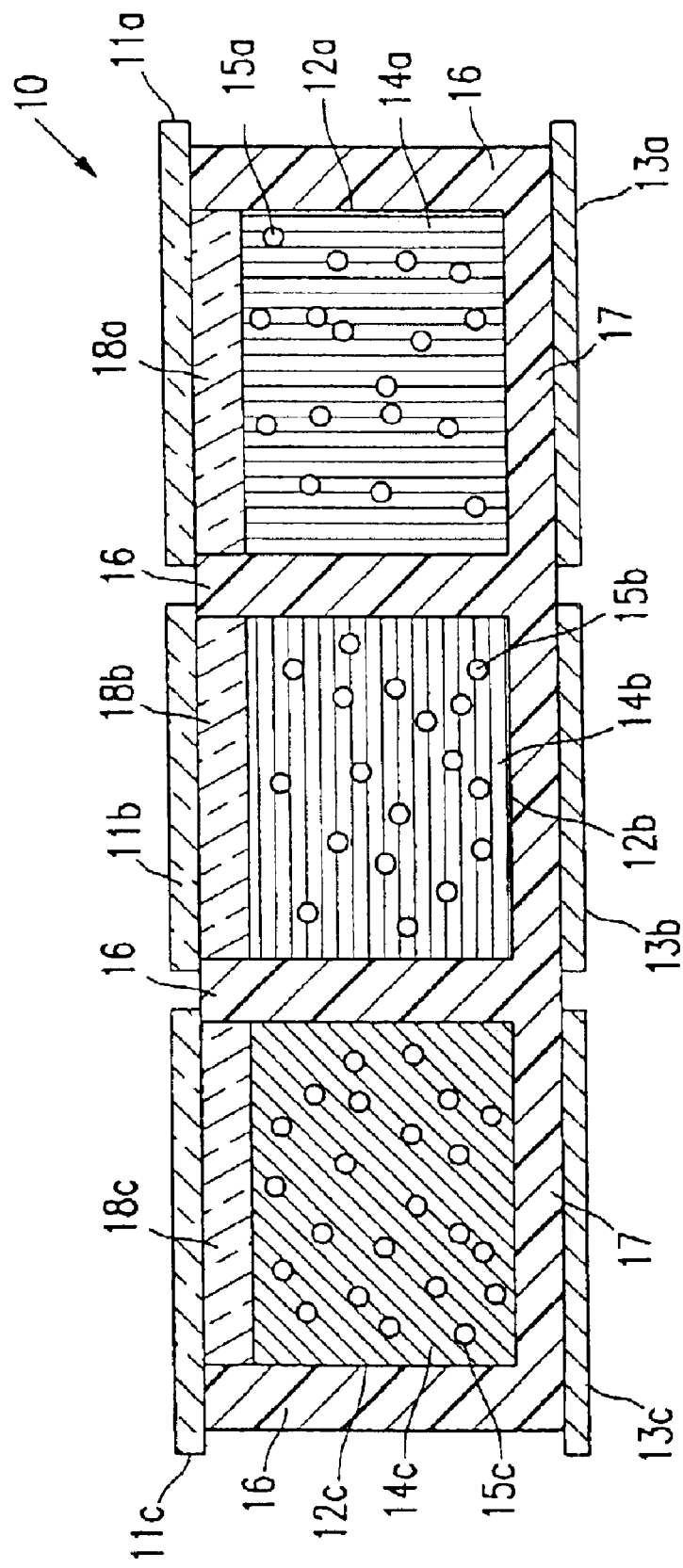
FIG. 1 is a schematic cross-section depiction of the electrophoretic display of the present invention, showing three microcup cells in a neutral condition.

The following detailed description illustrates the invention by way of example, not by way of limitation of the principles of the invention. This description will enable one skilled in the art to make and use the invention, and describes several embodiments, adaptations, variations, alternatives and uses of the invention, including what is presently believed to be the best mode of carrying out the invention.

In this regard, the invention is illustrated in several figures, and is of sufficient complexity that the many parts, interrelationships, and sub-combinations thereof simply cannot be clearly or meaningfully illustrated in a single patent-type drawing. Accordingly, several of the drawings show in schematic, or omit parts that are not essential in that drawing to a description of a particular feature, aspect or principle of the invention being disclosed. Thus, the best mode embodiment of one feature may be shown in one drawing, and the best mode of another feature will be shown in another drawing.

Certain examples are given herein to enable those skilled in the art to more clearly understand and to practice the present invention. These exemplary processes, methods, compositions and apparatus should not be considered as limiting the scope of the invention, but merely as being illustrative and representative thereof.

All publications and patent applications cited in this specification are herein incorporated by reference as if each individual publication or patent application were specifically and individually indicated to be incorporated by reference.
Definitions Unless defined otherwise in this specification, all technical terms are used herein according to their conventional definitions as they are commonly used and understood by those of ordinary skill in the art.

The term "microcup" refers to the cup-like indentations, which may be created by methods such as micro-embossing or imagewise exposure. Likewise, the plural form "microcups" in a collective context may in general refer to the microcup assembly comprising a plurality of such microcups integrally formed or joined to make a structured two-dimensional microcup array.

The term "cell", in the context of the present invention, is intended to mean the single unit formed from a sealed microcup. The cells are filled with charged pigment particles dispersed in a solvent or solvent mixture.

The term "well-defined", when describing the microcups or cells, is intended to indicate that the microcup or cell has a definite shape, size and aspect ratio which are pre-determined according to the specific parameters of the manufacturing process.

The term "aspect ratio" is a commonly known term in the art of electrophoretic displays. In this application, the term "aspect ratio" as applied to the microcup refers to the depth to width ratio or the depth to diameter of the microcup opening.

The term "imagewise exposure" means exposure of a radiation-curable material or photoresist composition to radiation, such as UV, using one of the methods of the invention, whereby the portions of the material so exposed are controlled to form a pattern or "image" corresponding to the structure of the microcups, e.g., the exposure is restricted to the portions of the material corresponding to the microcup walls, leaving the microcup floor portion unexposed. In the case of selectively opening photoresist on predetermined portions of the microcup array, imagewise exposure means exposure on the portions of material corresponding to the cup opening, leaving the microcup walls unexposed. The pattern or image may be formed by such methods as exposure through a photomask, or alternatively by controlled particle beam exposure, and the like.

Microcup Array and Methods of the Invention

Figure 2:
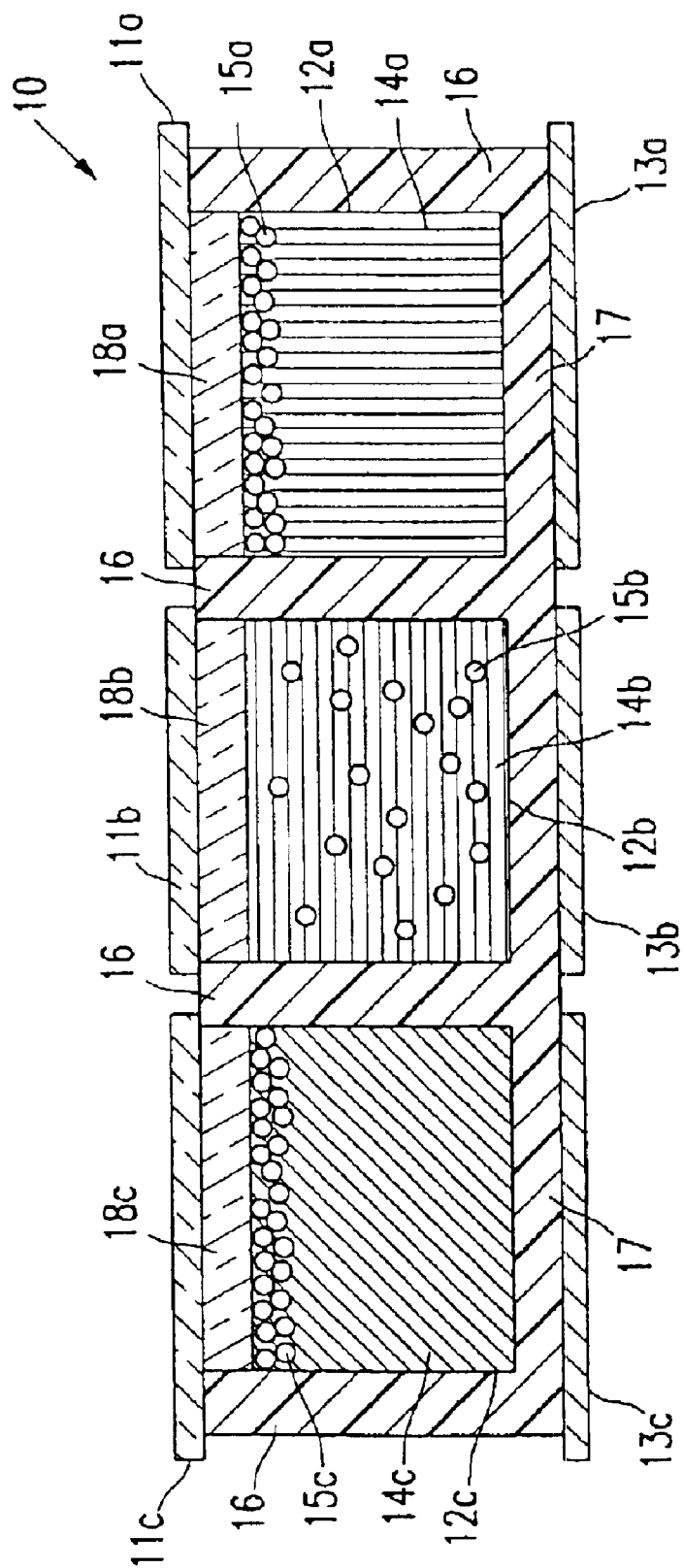
FIG. 2 is a schematic cross-section depiction of the electrophoretic display of FIG. 1, but with two of the cells charged, to cause the pigment to migrate to one plate.

FIGS. 1 and 2 are schematic cross-section views of an exemplary microcup array assembly embodiment, simplified for clarity, showing a microcup array assembly (10) of three microcup cells (12a, b, and c).

As shown in FIG. 1, each cell (12) of array (10) comprises two electrode plates (11, 13), at least one of which is transparent (11), such as an indium-tin oxide (ITO) electrode, the electrodes (11) and (13) bounding two opposite faces of the cell (12).

The microcup cell array assembly (10) comprises a plurality of cells which are disposed adjacent to one another within a plane to form a layer of cells (12) enclosed between the two electrodes layers (11) and (13). Three exemplary cells (12a), (12b), and (12c) are shown, bounded by their respective electrode plates (11a, 11b, and 11c) (transparent) and (13a, 13b, and 13c) (back plates), it being understood that a large number of such cells are preferably arrayed two-dimensionally (to the right/left and in/out of the plane in FIG. 1) to form a sheet-like display in any selected area in a two-dimensional shape. Likewise, several microcup cells may be bounded by a single electrode plate (11) or (13), although, for clarity, FIG. 1 shows an example in which each cell (12) is bounded by separate electrode plates (11 and 13) having the width of a single cell.

The cells are of well-defined shape and size and are filled with a colored dielectric solvent (14) in which charged pigment particles (15) are suspended and dispersed. The cells (12) may be each filled with the same composition of pigment and solvent (e.g., in a monochrome display) or may be filled with different compositions of pigment and solvent (e.g., in a full color display). FIG. 1 shows three different color combinations as indicated by the different hatch pattern in each cell (12a, 12b, and 12c), the solvents being designated (14a, 14b, and 14c) respectively, and the pigment particles being designated (15a, 15b, and 15c) respectively.

The microcup cells (12) each comprise enclosing walls (16) bounding the cells on the sides (within the plane of array (10)) and floor (17) bounding the cell on one face, in this example the face adjacent to electrode (13). On the opposite face (adjacent electrode (11)) each cell comprises sealing cap portion (18). Where the sealing cap portion is adjacent to the transparent electrode (11) (as in FIG. 1), the sealing cap (18) comprises a transparent composition. Although in the example of FIG. 1, the floor (17) and the sealing cap (18) are shown as separate cell portions distinct from adjacent electrodes (13) and (11) respectively, alternative embodiments of the microcup array (10) of the invention may comprise an integral floor/electrode structure or an integral sealing cap/electrode structure.

FIG. 2 is a schematic cross-section depiction of the electrophoretic display of FIG. 1, but with two of the cells charged (12a and 12c), to cause the pigment to migrate to one plate. When a voltage difference is imposed between the two electrodes (11, 13), the charged particles (15) migrate to one side (i.e., toward electrode (11 or 13) depending on the charge of the particle and electrode), such that either the color of the pigment particle (15) or the color of the solvent (14) is seen through the transparent conductor film (11). At least one of the two conductors (11) or (13) is patterned (separately addressable portions) to permit a selective electric field to be established with respect to either each cell or with respect to a pre-defined group of cells (e.g., to form a pixel).

In the example of FIG. 2, two of the cells are shown charged (12a and 12c), in which the pigment (15a and 15c) has migrated to the respective transparent electrode plates (11a and 11c). The remaining cell (12b) remains neutral (pigment (15b) is dispersed throughout solvent (14b)).

Figure 3B:
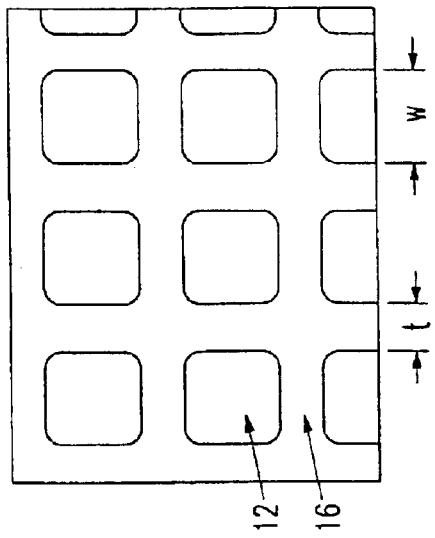
FIGS. 3A–3C shows the contours of an exemplary microcup array prepared by the method of the invention, FIG. 3A showing a perspective view, FIG. 3B showing a plan view, and FIG. 3C showing an elevation view, the vertical scale being exaggerated for clarity.
Figure 3A:
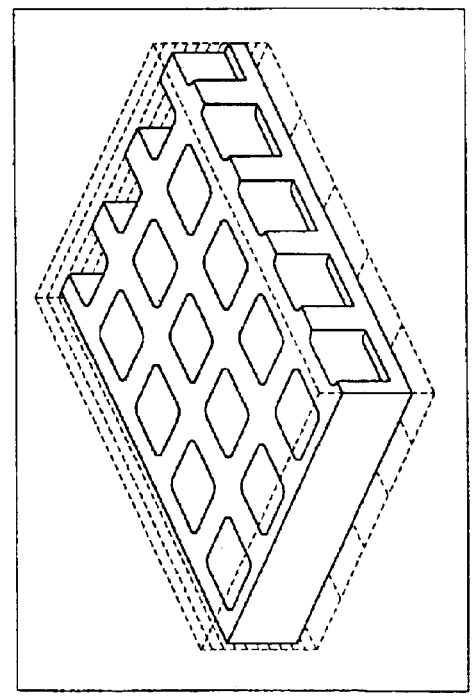
Figure 3C:
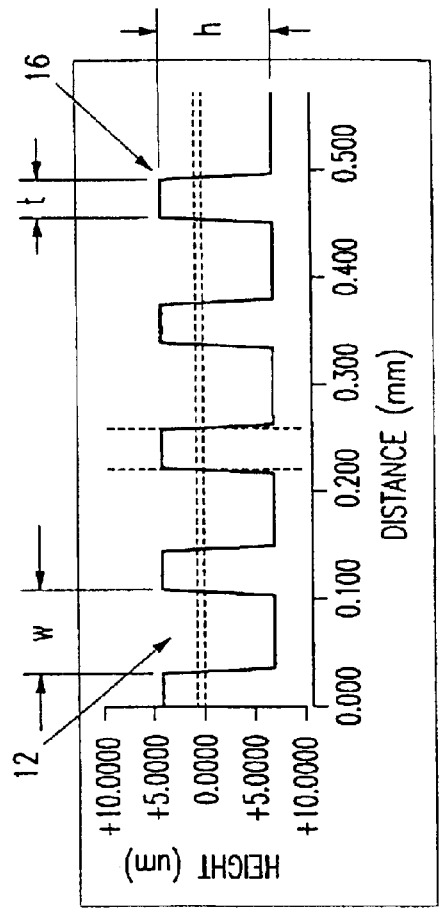

FIGS. 3A–3C shows the contours of an exemplary portion of a microcup array prepared by the method of the invention, FIG. 3A showing a perspective view, FIG. 3B showing a plan view, and FIG. 3C showing an elevation view, the vertical scale being exaggerated for clarity. For reflective electrophoretic displays, the opening area of each individual microcup may preferably be in the range of about $10^2$ to about $5 \times 10^5$ $\mu m^2$, more preferably from about $10^3$ to about $5 \times 10^4$ $\mu m^2$. The width w of the microcup (12) (distance between adjacent walls (16)) may vary over a wide range, and is selectable to suit the desired final display characteristics. The width w of the microcup openings preferably is in the range of from about 15 to about 450 $\mu m$, and more preferably from about 25 to about 300 $\mu m$ from edge to edge of the openings. Each microcup may form a small segment of a pixel of the final display, or may be a full pixel.

The wall thickness t relative to the cup width w may vary over a large range, and is selectable to suit the desired final display characteristics. The microcup wall thickness is typically from about 0.01 to about 1 times the microcup width, and more preferably about 0.05 to about 0.25 times the microcup width. The opening-to-wall area ratio is preferably in the range of from about 0.05 to about 100, more preferably from about 0.4 to about 20.

The microcup wall height h (which defines the cup depth) is shown exaggerated beyond its typical proportional dimensions for clarity. Although the wall height may be of a wide range relative to the cup width w, the optimum height will depend to an extent on the solvent and pigment characteristics and the desired operating electric field. Thus the wall height may be selected to optimize the display response characteristics, and need not be any fixed relationship to cell width. The proportional height of the wall may typically be greater in comparison to a small micro cup width than in comparison to a large microcup width. Most typically, the wall height is less than the microcup width. Preferably, the height of the microcups is in the range of about 3 to about 100 microns ($\mu m$), preferably from about 10 to about 50 $\mu m$.

For simplicity and clarity, a square microcup arranged in a linear two-dimensional array assembly is assumed in the description herein of the microcup array assembly of the invention. However, the microcup need not be square, it may be rectangular, circular, or a more complex shape if desired. For example, the microcups may be hexagonal and arranged in a hexagonal close-packed array, or alternatively, triangular cups may be oriented to form hexagonal sub-arrays, which in turn are arranged in a hexagonal close-packed array.

In general, the microcups can be of any shape, and their sizes and shapes may vary throughout the display. This may be advantageous in the color EPD. In order to maximize the optical effect, microcups having a mixture of different shapes and sizes may be produced. For example, microcups filled with a dispersion of the red color may have a different shape or size from the green microcups or the blue microcups. Furthermore, a pixel may consist of different numbers of microcups of different colors. For example, a pixel may consist of a number of small green microcups, a number of large red microcups, and a number of small blue microcups. It is not necessary to have the same shape and number for the three colors.

The openings of the microcups may be round, square, rectangular, hexagonal, or any other shapes. The partition area between the openings is preferably kept small in order to achieve a high color saturation and contrast while maintaining desirable mechanical properties. Consequently the honeycomb-shaped opening is preferred over, for example, the circular opening.

Preparation Of Electrophoretic Displays from the Microcup Array

The preferred process of preparing the microcup array is illustrated schematically in FIGS. 4A–4D.

Figure 4A:
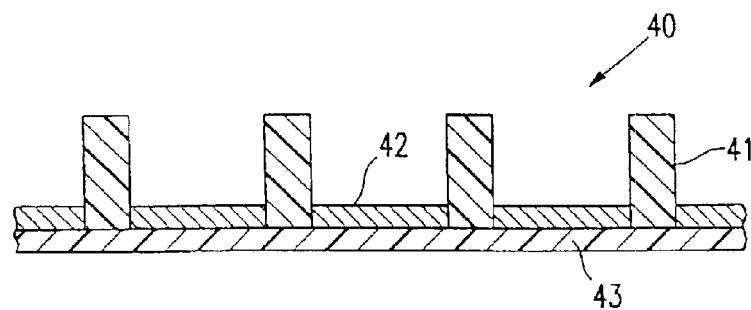
FIGS. 4A–4D are a sequence of cross sections of an exemplary microcup array of the invention, illustrating the steps of a preferred method of assembly of the EPD of the invention, in this example, a monochrome display.

As shown in FIG. 4A, the microcup array (40) may be prepared by any of the alternative methods of the invention, such as those examples illustrated in FIGS. 5, 6 and 7. The unfilled microcup array made by the methods described herein typically comprises a substrate web (43) upon which a base electrode (42) is deposited. The microcup walls (41) extend upward from the substrate (43) to form the open cups.

Figure 4B:
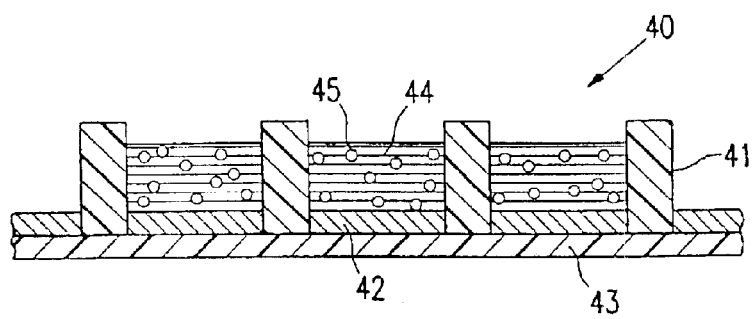

As shown in FIG. 4B, the microcups are filled with a suspension of the charged pigment particles (45) in a colored dielectric solvent composition (44). In the example shown, the composition is the same in each cup, i.e., in a monochrome display. An example of the assembly of a color display, in which three different colored solvent/pigment compositions are employed, is described below in FIG. 9.

Figure 4C:
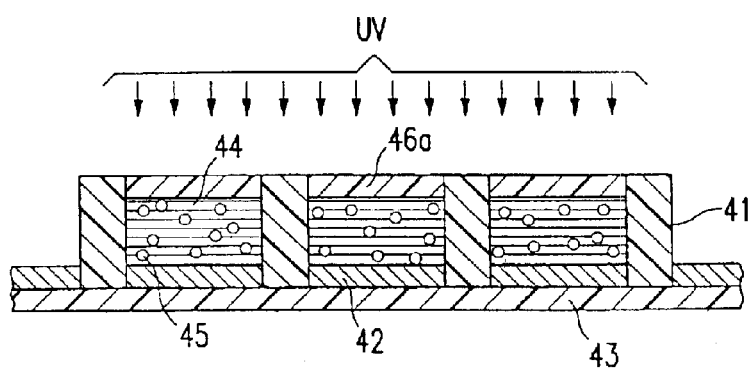

As shown in FIG. 4C, after filling, the microcups are sealed with a sealing or cap layer (46), which bonds to the microcup walls and prevents solvent leakage. In one currently preferred sealing method, a thermoset precursor sealing composition (46a) is added to the solvent/pigment composition (44/45). The thermoset precursor (46a) composition preferably is not miscible or soluble in the solvent and has a lower specific gravity than the solvent and the pigment particles. The thermoset precursor (46a) separates and forms a supernatant layer on top of the liquid phase solvent (44). The thermoset precursor (46a) preferably is then cured by radiation such as UV (alternatively by heat or moisture) to form a bonded seal cap (46b) enclosing the microcups (40). Alternatively, the sealing of the microcups may be accomplished by directly overcoating and curing a layer of the thermoset precursor composition over the surface of the electrophoretic fluid. More details of the sealing methods are discussed in the following sections.

Figure 4D:
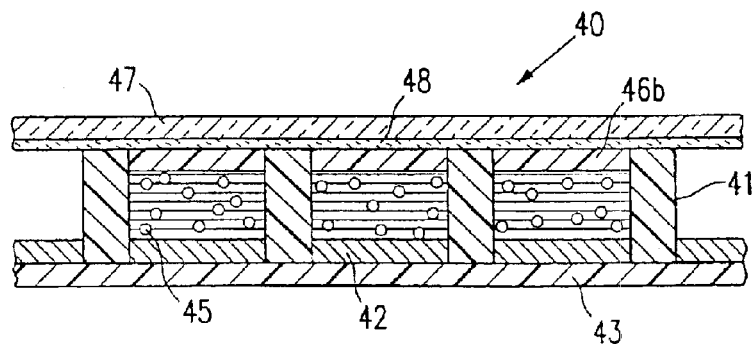

As shown in FIG. 4D, the sealed array of electrophoretic microcup cells (40) is laminated With a second conductor film (47), preferably by pre-coating the conductor (47) with an adhesive layer (48) which may be a pressure sensitive adhesive, a hot melt adhesive, or a heat, moisture, or radiation curable adhesive. The laminate adhesive may be post-cured by radiation such as UV through the top conductor film if the latter is transparent to the radiation.

Preparation of the Pigment/Solvent Suspension or Dispersion Composition

As described herein with respect to the various embodiments of the EPD of the invention, the microcups are preferably filled with charged pigment particles dispersed in a dielectric solvent (e.g., solvent (44) and pigment particles (45) in FIG. 4B.). The dispersion may be prepared according to methods well known in the art, such as U.S. Pat. Nos. 6,017,584, 5,914,806, 5,573,711, 5,403,518, 5,380,362, 4,680,103, 4,285,801, 4,093,534, 4,071,430, and 3,668,106. See also *IEEE Trans. Electron Devices,* ED-24, 827 (1977), and *J. Appl. Phys.* 49(9), 4820 (1978).

The charged pigment particles visually contrast with the medium in which the particles are suspended. The medium is a dielectric solvent which preferably has a low viscosity and a dielectric constant in the range of about 2 to about 30, preferably about 2 to about 15 for high particle mobility. Examples of suitable dielectric solvents include hydrocarbons such as decahydronaphthalene (DECALIN), 5-ethylidene-2-norbornene, fatty oils, paraffin oil, aromatic hydrocarbons such as toluene, xylene, phenylxylylethane, dodecylbenzene and alkylnaphthalene, halogenated solvents such as dichlorobenzotrifluoride, 3,4,5-trichlorobenzotriflouride, chloropentafluoro-benzene, dichlorononane, pentachlorobenzene, and perfluoro solvents such as perfluorodecalin, perfluorotoluene, perfluoroxylene, FC-43, FC-70 and FC-5060 from 3M Company, St. Paul Minn., low molecular weight halogen containing polymers such as poly(perfluoropropylene oxide) from TCI America, Portland, Oreg., poly(chlorotrifluoroethylene) such as Halocarbon Oils from Halocarbon Product Corp., River Edge, N.J., perfluoropolyalkylether such as Galden, HT-200, and Fluorolink from Ausimont or Krytox Oils and Greases K-Fluid Series from DuPont, Del. In one preferred embodiment, poly(chlorotrifluoroethylene) is used as the dielectric solvent. In another preferred embodiment, poly (perfluoropropylene oxide) is used as the dielectric solvent.

The non-migrating fluid colorant may be formed from dyes or pigments. Nonionic azo and anthraquinone dyes are particularly useful. Examples of useful dyes include, but are not limited to: Oil Red EGN, Sudan Red, Sudan Blue, Oil Blue, Macrolex Blue, Solvent Blue 35, Pylam Spirit Black and Fast Spirit Black from Pylam Products Co., Arizona, Sudan Black B from Aldrich, Thermoplastic Black X-70 from BASF, and anthraquinone blue, anthraquinone yellow 114, anthraquinone red 111, 135, anthraquinone green 28 from Aldrich. Fluorinated dyes are particularly useful when perfluoro solvents are used. In the case of a pigment, the non-migrating pigment particles for generating the color of the medium may also be dispersed in the dielectric medium. These color particles are preferably uncharged. If the non-migrating pigment particles for generating color in the medium are charged, they preferably carry a charge which is opposite from that of the charged migrating pigment particles. If both types of pigment particles carry the same charge, then they should have different charge density or different electrophoretic mobility. In any case, the dye or pigment for generating the non-migrating fluid colorant of the medium must be chemically stable and compatible with other components in the suspension.

The charged, migrating pigment particles may be organic or inorganic pigments, such as $TiO_2$, phthalocyanine blue, phthalocyanine green, diarylide yellow, diarylide AAOT Yellow, and quinacridone, azo, rhodamine, perylene pigment series from Sun Chemical, Hansa yellow G particles from Kanto Chemical, and Carbon Lampblack from Fisher. Submicron particle size is preferred. These particles should have acceptable optical characteristics, should not be swollen or softened by the dielectric solvent, and should be chemically stable. The resulting suspension must also be stable against sedimentation, creaming or flocculation under normal operating conditions.

The migrating pigment particles may exhibit a native charge, or may be charged explicitly using a charge control agent, or may acquire a charge when suspended in the dielectric solvent. Suitable charge control agents are well known in the art; they may be polymeric or non-polymeric in nature, and may also be ionic or non-ionic, including ionic surfactants such as Aerosol OT, sodium dodecylbenzenesulfonate, metal soaps, polybutene succinimide, maleic anhydride copolymers, vinylpyridine copolymers, vinylpyrrolidone copolymer (such as Ganex from International Specialty Products), (meth)acrylic acid copolymers, N,N-dimethylaminoethyl (meth)acrylate copolymers. Fluorosurfactants are particularly useful as charge controlling agents in perfluorocarbon solvents. These include FC fluorosurfactants such as FC-170C, FC-171, FC-176, FC430, FC431 and FC-740 from 3M Company and Zonyl fluorosurfactants such as Zonyl FSA, FSE, FSN, FSN-100, FSO, FSO-100, FSD and UR from Dupont.

Suitable charged pigment dispersions may be manufactured by any of the well-known methods including grinding, milling, attriting, microfluidizing, and ultrasonic techniques. For example, pigment particles in the form of a fine powder are added to the suspending solvent and the resulting mixture is ball milled or attrited for several hours to break up the highly agglomerated dry pigment powder into primary particles. Although less preferred, a dye or pigment for producing the non-migrating fluid colorant may be added to the suspension during the ball milling process.

Sedimentation or creaming of the pigment particles may be eliminated by microencapsulating the particles with suitable polymers to match the specific gravity to that of the dielectric solvent. Microencapsulation of the pigment particles may be accomplished chemically or physically. Typical microencapsulation processes include interfacial polymerization, in-situ polymerization, phase separation, coacervation, electrostatic coating, spray drying, fluidized bed coating and solvent evaporation.

For a black/white electrophoretic display, the suspension comprises charged white particles of titanium oxide ($TiO_2$) dispersed in a black solvent or charged black particles dispersed in a dielectric solvent. A black dye or dye mixture such as Pylam Spirit Black and Fast Spirit Black from Pylam Products Co. Arizona, Sudan Black B from Aldrich, Thermoplastic Black X-70 from BASF, or an insoluble black pigment such as carbon black may be used to generate the black color of the solvent. For other colored suspensions, there are many possibilities. For a subtractive color system, the charged $TiO_2$ particles may be suspended in a dielectric solvent of cyan, yellow or magenta color. The cyan, yellow or magenta color may be generated via the use of a dye or a pigment. For an additive color system, the charged $TiO_2$ particles may be suspended in a dielectric solvent of red, green or blue color generated also via the use of a dye or a pigment. The red, green, blue color system is preferred for most applications.

EXAMPLE 1

Pigment Dispersion

Polystyrene (0.89 grams, Polysciences Inc., mw. 50,000) and AOT (0.094 grams, American Cyanamide, sodium dioctylsulfosuccinate) were dissolved in 17.77 grams of hot xylene (Aldrich). Ti-Pure R-706 (6.25 grams) was added to the solution and ground in an attritor at 200 rpm for more than 12 hours. A low viscosity, stable dispersion was obtained. Oil-blue N (0.25 grams, Aldrich) was added to color the dispersion. The suspension was then tested in a standard electrophoretic cell comprising two ITO conductor plates separated by a 24 micron spacer. High contrast, alternating white and blue images were observed with a switching rate of about 60 Hz and a rising time of 8.5 msec at 80 volts.

EXAMPLE 2

Pigment Dispersion

The test of Pigment Dispersion Example 1 was repeated, except Oil Red EGN (Aldrich) was used. High contrast, alternating red and white images were observed with a switching rate of 60 Hz and a rising time of 12 msec at 60 volts.

EXAMPLE 3

Pigment Dispersion

Ti-Pure R-706 (112 grams) was ground by an attritor in a solution containing 11.2 grams of a maleic anhydride copolymer (Baker Hughes X-5231), 24 grams of 3,4-dichlorobenzotrifluoride, and 24 grams of 1,6-dichlorohexane (both from Aldrich). Similarly, 12 grams of carbon black were ground in a solution containing 1.2 grams of alkylated polyvinylpyrrolidone (Ganex V216 from ISP), 34 grams of 3,4-dichlorobenzotrifluoride, and 34 grams of 1,6-dichlorohexane (Aldrich) at 100° C. These two dispersions were then mixed homogeneously and tested. High contrast black and white images were observed with a switching rate up to 10 Hz and a rising time of about 36 msec at 100 volts.

EXAMPLE 4

Pigment Dispersion 6.42 Grams of Ti Pure R706 was dispersed with a homogenizer into a solution containing 1.94 grams of Fluorolink D from Ausimont, 0.22 grams of Fluorolink 7004 also from Ausimont, 0.37 grams of a fluorinated cyan dye from 3M, and 52.54 grams of perfluoro solvent HT-200 (Ausimont).

EXAMPLE 5

Pigment Dispersion

The same as Example 4, except the Ti Pure R706 and Fluorolink were replaced by polymer coated $TiO_2$ particles from Elimentis (Hihstown, N.J.) and Krytox (from Du Pont) respectively.

Sealing of the Microcup Array.

The filled microcups of the array are enclosed and sealed, e.g., as shown in FIG. 4C. The sealing of the microcups may be accomplished in a number of ways. As discussed earlier, a preferred approach is to disperse a UV curable composition containing multifunctional acrylates, acrylated oligomers, and photoinitiators into an electrophoretic fluid containing charged pigment particles dispersed in a colored dielectric solvent. The UV curable composition is immiscible with the dielectric solvent and has a specific gravity lower than that of the dielectric solvent and the pigment particles. The two components, UV curable composition and the electrophoretic fluid, are thoroughly blended in an in-line mixer and immediately coated onto the microcups with a precision coating mechanism such as Myrad bar, gravure, doctor blade, slot coating or slit coating. Excess fluid is scraped away by a wiper blade or a similar device. A small amount of a weak solvent or solvent mixture such as isopropanol, methanol, or their aqueous solutions may be used to remove the residual electrophoretic fluid on the top surface of the partition walls of the microcups. Volatile organic solvents may be used to control the viscosity and coverage of the electrophoretic fluid. The thus-filled microcups are then dried and the UV curable sealing composition floats to the top of the electrophoretic fluid. The microcups may be sealed by curing the supernatant UV curable layer during or after it floats to the top. UV or other forms of radiation such as visible light, IR and electron beam may be used to cure and seal the microcups. Alternatively, heat or moisture may also be employed to cure and seal the microcups, when heat or moisture curable compositions are used.

A preferred group of dielectric solvents exhibiting desirable density and solubility discrimination against acrylate monomers and oligomers are halogenated hydrocarbons and their derivatives. Surfactants may be used to improve the adhesion and wetting at the interface between the electrophoretic fluid and the sealing materials. Useful surfactants include the FC surfactants from 3M Company, Zonyl fluorosurfactants from DuPont, fluoroacrylates, fluoromethacrylates, fluoro-substituted long chain alcohols, perfluoro-substituted long chain carboxylic acids and their derivatives.

Alternatively, the electrophoretic fluid and the sealing precursor may be coated sequentially into the microcups, if the sealing precursor is at least partially compatible with the dielectric solvent. Thus, the sealing of the microcups may be accomplished by overcoating a thin layer of thermoset precursor which is curable by radiation, heat, moisture or interfacial reactions and curing on the surface of the filled microcups. Interfacial polymerization followed by UV curing is very beneficial to the sealing process. Intermixing between the electrophoretic layer and the overcoat is significantly suppressed by the formation of a thin barrier layer at the interface by interfacial polymerization. The sealing is then completed by a post curing step, preferably by UV radiation. To further reduce the degree of intermixing, it is highly desirable that the specific gravity of the overcoating is significantly lower than that of the electrophoretic fluid. Volatile organic solvents may be used to adjust the viscosity and the thickness of the coatings. When a volatile solvent is used in the overcoat, it is preferred that it is immiscible with the dielectric solvent. The two-step overcoating process is particularly useful when the dye used is at least partially soluble in the thermoset precursor.

EXAMPLE 6

Microcup Sealing

In this example of the "one-step" process of the invention, approximately 0.05 milliliter of UV curable composition comprising 1 wt % of benzil dimethyl ketal (Esacure KBI from Sartomer) in HDDA (1,6-hexanediol diacrylate from Aldrich) were dispersed into 0.4 ml of a dielectric solvent comprising 0.5 wt % of 2,2,3,3,4,4,5,5, 6,6,7,7,8,8,9,9,10, 10,10-nonadecafluoro-1-decanol (Aldrich) in FC-43 from 3M Company. The resultant dispersion was then immediately filled into an array of microcups. Excess of fluid was scrapped away by a wiper blade. The HDDA solution was allowed to phase separate for at least 30 seconds and cured by UV radiation (10 mw/cm$^2$) for about 1 minute. A hard, clear layer was observed on the top of the microcups and the microcups were sealed.

EXAMPLE 7

Microcup Sealing

In this example, the two-step overcoating and UV curing process of the invention was tested. The electrophoretic dispersion fluid, as prepared in Pigment Dispersion Example 3, was coated onto the microcup array. A thin layer of Norland optical adhesive NOA 60 (Norland Products Inc., New Brunswick, N.J.) was coated onto the filled microcups. Any excess of the UV adhesive was scrapped off by a strip of Mylar film and cleaned by a piece of absorbing paper. The overcoated adhesive was then cured immediately under a Loctite Zeta 7410 UV exposure unit for about 15 minutes. The microcups were sealed completely and no air pocket was observed. The thickness of cured adhesive layer was about 5–10 microns as measured by a Mitutoyo thickness gauge.

EXAMPLE 8

Microcup Sealing

In this example, the two-step overcoating and moisture curing process of the invention was tested. The test of Microcup Sealing Example 2 was repeated, except the Norland adhesive was replaced by Instant Krazy Glue from Elmer's Products, Inc., Columbus, Ohio. The overcoated adhesive was then cured for 5 minutes by moisture in air. The microcups were sealed completely and no air pocket was observed. The thickness of cured adhesive layer was about 5–10 microns as measured by a Mitutoyo thickness gauge.

EXAMPLE 9

Microcup Sealing

In this example, the two-step overcoating and interfacial polymerization process of the invention was performed. The experiment of Microcup Sealing Example 3 was repeated, except the electrophoretic fluid was replaced by a 3,4-dichlorobenzotrifluoride solution containing 0.3 wt % of tetraethylenepentaamine (Aldrich) and the Instant Krazy glue was replaced by an aliphatic polyisocyanate (Desmodur N 3300 from Bayer Corp.) solution in anhydrous ether. A highly crosslinked thin film was observed almost immediately after overcoating. The dielectric solvent was completely sealed inside the microcups after the ether was evaporated at room temperature. No air pocket was observed.

EXAMPLE 10

Microcup Sealing

The samples prepared by the Pigment Dispersion Examples 4 and 5 in perfluoro solvent HT200 were diluted with a volatile perfluoro cosolvent FC-33 from 3M and coated onto a microcup array. The volatile cosolvent was allowed to be evaporated to expose a partially filled microcup array. A 7.5% solution of polyisoprene in heptane was then overcoated onto the partially filled cups by a Universal Blade Applicator with an opening of 6 mil. The overcoated microcups were then dried at room temperature. A seamless sealing layer of about 7 microns thickness was observed under microscope. Little entrapped air bubble was observed in the sealed microcups. The sample was then post treated by UV radiation or thermal baking to further improve the barrier properties.

EXAMPLE 11

Preparation of the Radiation-Curable Material

The composition shown in Table 1 was coated onto Mylar J101/200 gauge web using a Nickel Chrome bird type film applicator with an opening of 3 mil. The solvent was allowed to evaporate leaving behind a tacky film with a Tg (glass transition temperature) below room temperature. The coated web was then exposed through a mask and UV cured by a UV source such as a metal fluoride lamp.

TABLE 1

PMMA-containing UV curable composition

| No. | Description | Ingredient | Supplier | parts |
|---|---|---|---|---|
| 1 | Epoxy acrylate | Ebecryl 3605 | UCB Chemicals | 7.35 |
| 2 | Monomer | Sartomer SR205 | Sartomer | 9.59 |
| 3 | Urethane acrylate | Ebecryl 6700 | UCB Chemicals | 4.87 |
| 4 | Polymethyl-methacrylate | Elvacite 2051 | ICI | 9.11 |
| 5 | Photoinitiator | Darocur 1173 | Ciba | 1.45 |
| 6 | Cationic photoinitiator | Cyracure UVI 6976 | Union Carbide | 0.60 |
| 7 | Solvent | Acetone | Aldrich | 67.03 |
| | | Total | | 100.00 |

The solvents for removing the uncured composition following the imagewise exposure of the method of the invention may be conventional. The solvents may be conventional solvents or solvent mixtures which are selected to minimize the degree of swelling of the image-cured composition. Typical solvents include MEK, MPK, EtOAc, BuOH, isopropanol, methanol, cyclohexanone, dichloroethane, trichloroethane, methoxyethyl alcohol, and the like.

EXAMPLE 12

Preparation of the Radiation-Curable Cup Material

12 Parts of Ebercryl 600 (UCB Chemicals, Smyrna, Ga.), 2.7 parts of Ebecryl 4827, 1 part of Ebecryl 1360, 6 parts of HDDA (UCB Chemicals), and 1 part of Irgacure 500 (Ciba Specialty Chemicals, Tarrytown, N.Y.), were mixed homogeneously with 5 parts of methyl ethyl ketone (MEK). The solution was coated onto an ITO/PET film by Myrad bar with a target dry thickness of 50 microns. The coated sample was then exposed through a mask and developed with isopropanol.

EXAMPLE 13

Preparation of the Radiation-Curable Cup Material

The same as Example 12, except the formulation was replaced by 12 parts of Ebecryl 830, 5.5 parts of SR399

(Sartomer, Exton, PA), 2 parts of HDDA, 0.488 parts of Ebecryl 1360, 0.1 parts of Irgacure 369 (Ciba Specialty Chemicals), 0.02 parts of isopropyl thioxanthone (ITX) from Aldrich, and 10 parts of MEK.

EXAMPLE 14

Preparation of the Radiation-Curable Cup Material

The same as Example 13, except the formulation was replaced by 7 parts of Ebecryl 600, 8 parts of SR399, 1 part of HDDA, 2.6 parts of Ebecryl 4827, 1.4 parts of Ebecryl 1360, 0.1 parts of Irgacure 369, 0.02 parts of ITX, and 10 parts of MEK.

Photolithographic Method of Preparation of the Microcup Assembly.

The general photolithographic process embodiments for preparation of the microcup assembly of the invention ((40) in FIG. 4) are shown in FIGS. 5, 6 and 7, and the description of the particular synchronized roll-to-roll photo-lithographic apparatus and method of the invention is given below.

Top Exposure Method Embodiment

Figure 5A:
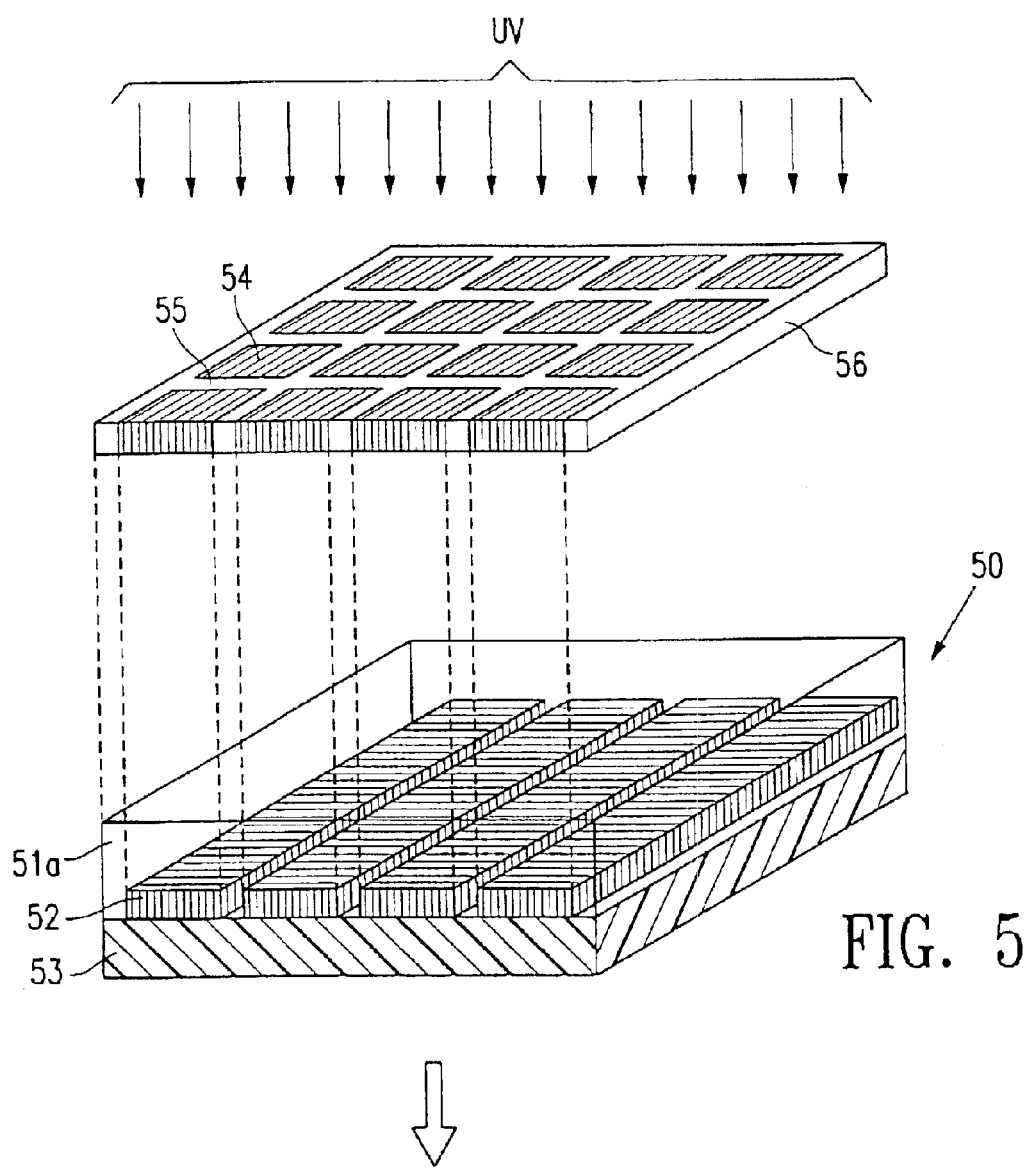
FIGS. 5A and 5B show the basic processing steps for preparing the microcups involving imagewise photolithographic exposure through a photomask ("top exposure") of the conductor film coated with a thermoset precursor to UV radiation.
Figure 5B:
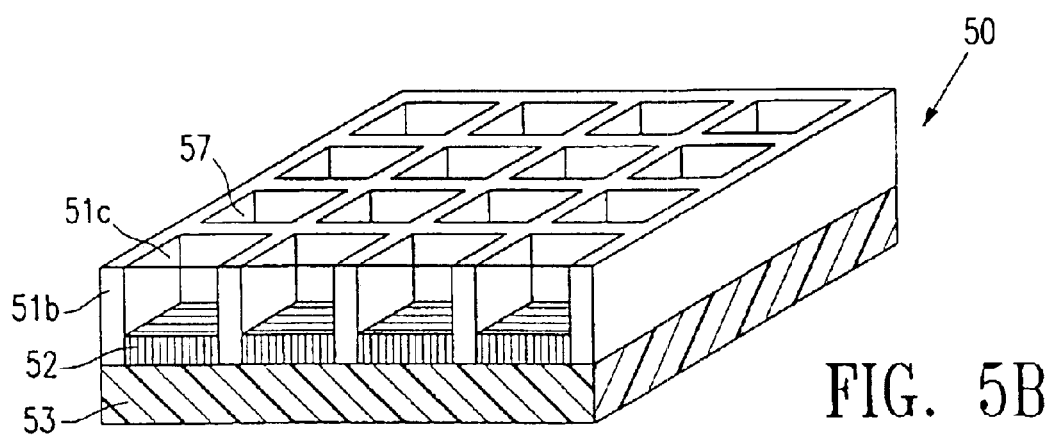

As shown in FIGS. 5A and 5B, the microcup array (50) may be prepared by exposure of a radiation curable material (51a) coated by known methods onto a conductor electrode film (52) to UV light (or alternatively other forms of radiation, electron beams and the like) through a mask (56) to form walls (51b) corresponding to the image projected through the mask (56). The base conductor film (52) is preferably mounted on a supportive substrate base web (53), which may comprise a plastic material.

In the photomask (56) in FIG. 5A, the dark squares (54) represent the opaque area and the space between the dark squares represents the opening (transparent) area (55) of the mask (56). The UV radiates through the opening area (55) onto the radiation curable material (51a). The exposure is preferably directly onto the radiation curable material (51a), i.e., the UV does not pass through the substrate (53) or base conductor (52) (top exposure). For this reason, neither the substrate (53) nor the conductor (52) needs to be transparent to the UV or other radiation wavelengths employed. As shown in FIG. 5B, the exposed areas (51b) become hardened and the unexposed areas (51c) (protected by the opaque area (54) of the mask (56)) are then removed by an appropriate solvent or developer to form the microcups (57). The solvent or developer is selected from those commonly used for dissolving or reducing the viscosity of radiation curable materials such as methylethylketone, toluene, acetone, isopropanol or the like. The preparation of the microcups may be similarly accomplished by placing a photomask underneath the conductor film/substrate base web and in this case the UV light radiates through the photomask from the bottom.

Bottom Exposure and Combination Method

Two alternative methods for the preparation of the microcup array of the invention by imagewise exposure are illustrated in FIGS. 6A and 6B and 7A and 7B. These methods employ UV exposure through the substrate web, using the conductor pattern as a mask.

Figure 6B:
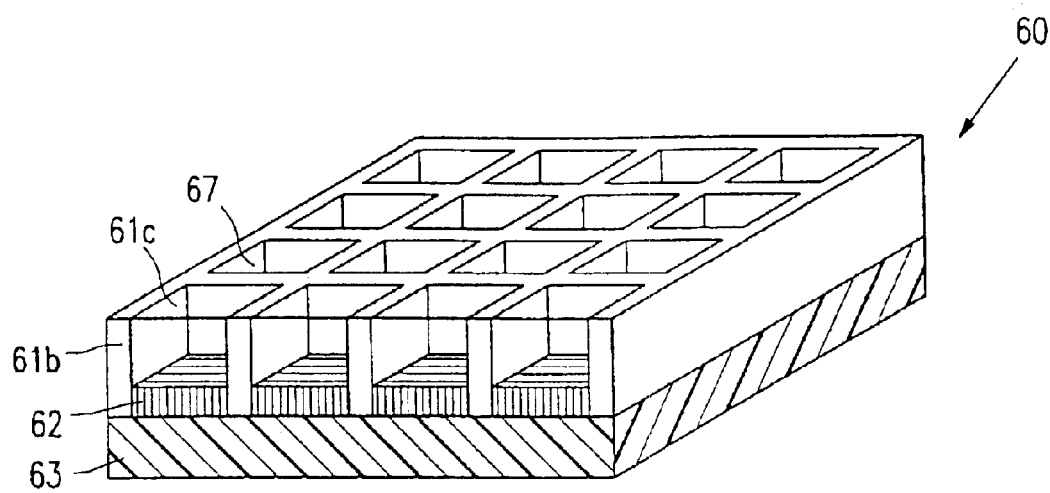
FIGS. 6A and 6B show alternative processing steps for preparing the microcups involving imagewise photolithographic exposure of the base conductor film coated with a thermoset precursor to UV radiation, in which the base conductor pattern on a transparent substrate serves a substitute for a photomask ("bottom exposure") and is opaque to the radiation.
Figure 6A:
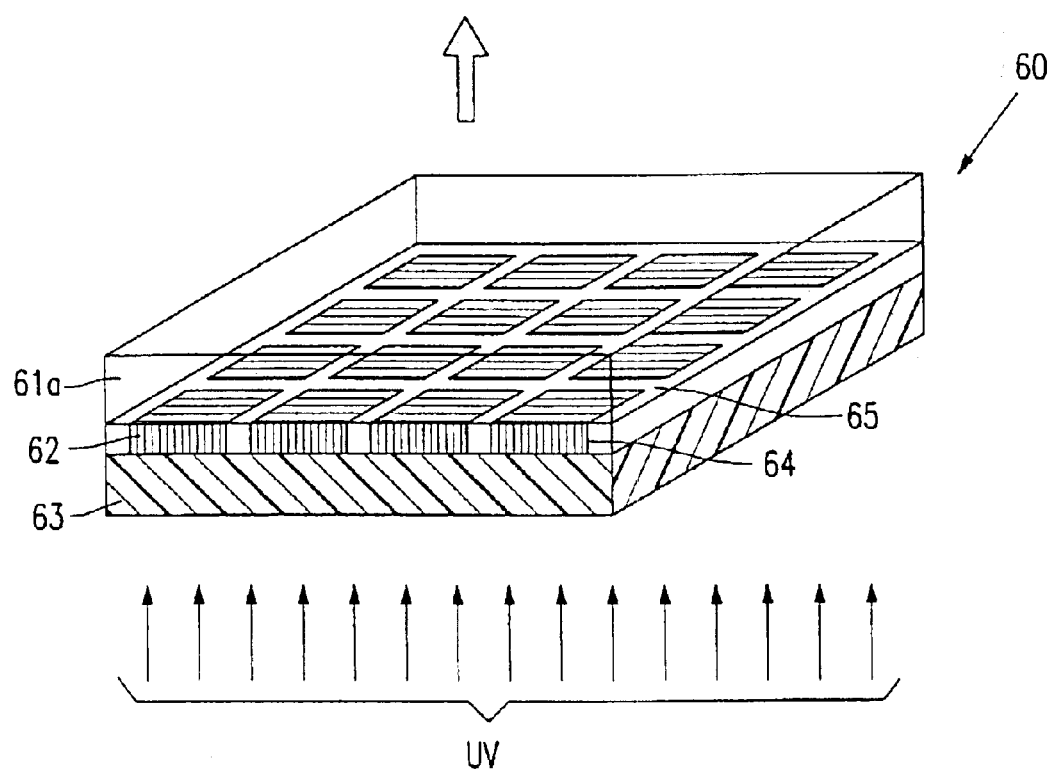

In FIG. 6A, the conductor film (62) used is pre-patterned to comprise cell base electrode portions (64) corresponding to the floor portions of the microcups (67). The base portions (64) are opaque to the UV wavelength (or other radiation) employed. The spaces (65) between conductor base portions (62) are substantially transparent or transmissive to the UV light. In this case, the conductor pattern serves as a photomask. The radiation curable material (61a) is coated upon the substrate (63) and the conductor film (62) as described in FIG. 6A. The material (61a) is exposed by UV light projected "upwards" (through substrate (63)) and cured where not shielded by the conductor (62), i.e., in those areas corresponding to the space (65). As shown in FIG. 6B, the uncured material (61c) is removed from the unexposed areas as described above, leaving the cured material (61b) to form the walls of the microcups (67).

Figure 7B:
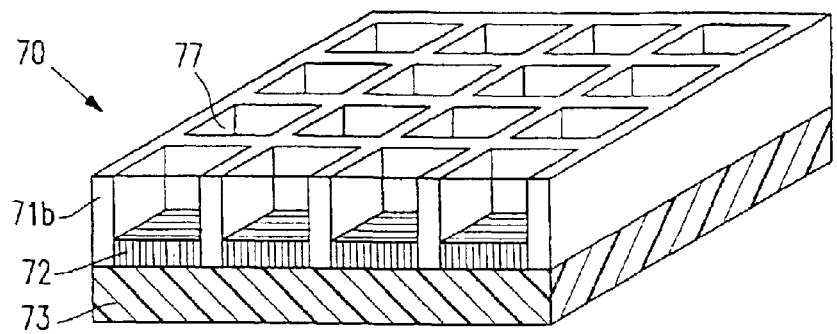
FIGS. 7A and 7B show alternative processing steps for preparing the microcups involving imagewise photolithographic combining the top exposure and bottom exposure principles, whereby the walls are cured in one lateral direction by top photomask exposure and in the perpendicular lateral direction by bottom exposure through the opaque base conductor film ("combined exposure").
Figure 7A:
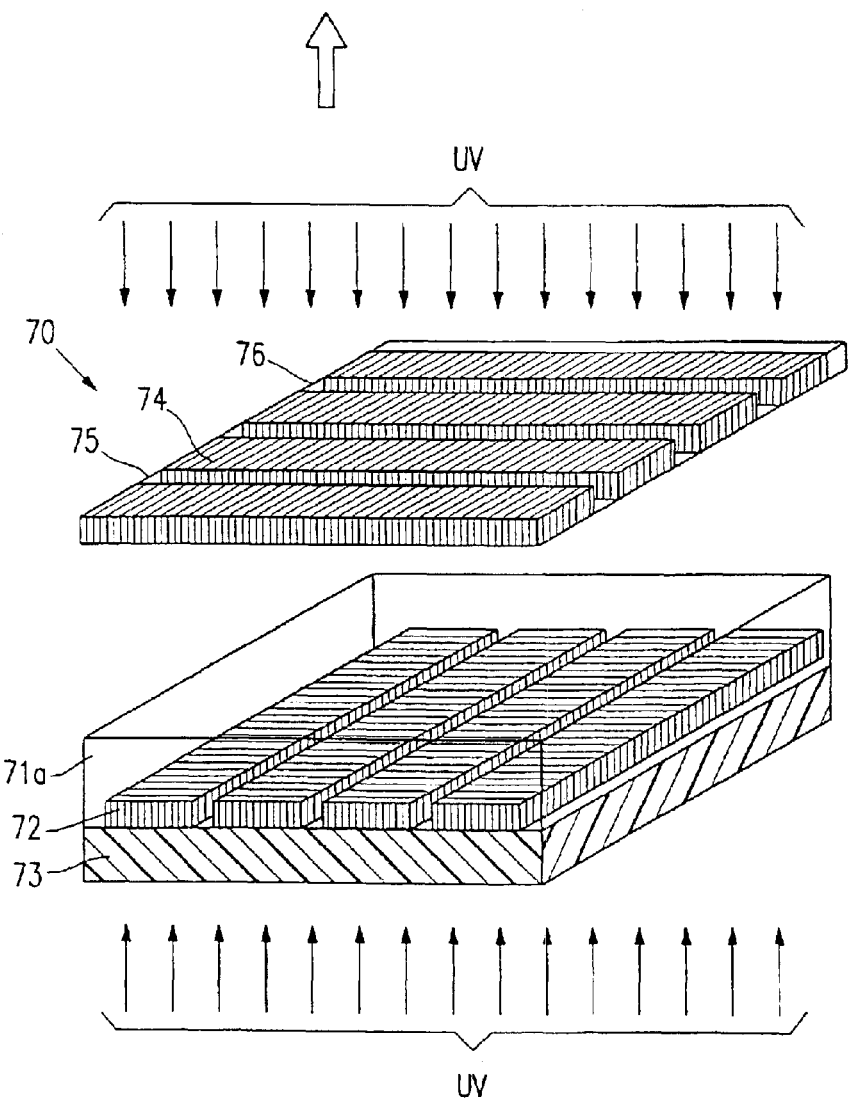

FIG. 7A illustrates a combination method which uses both the top and bottom exposure principals to produce the microcup array (70) of the invention. The base conductor film (72) is also opaque and line-patterned. The radiation curable material (71a), which is coated on the base conductor (72) and substrate (73), is exposed from the bottom through the conductor line pattern (72) which serves as the first photomask. A second exposure is performed from the "top" side through the second photomask (76) having a line pattern perpendicular to the conductor lines (72). The spaces (75) between the lines (74) are substantially transparent or transmissive to the UV light. In this process, the wall material (71b) is cured from the bottom up in one lateral orientation, and cured from the top down in the perpendicular direction, joining to form an integral microcup (77).

As shown in FIG. 7B, the unexposed area is then removed by a solvent or developer as described above to reveal the microcups (77).

Synchronized Roll-to-Roll Photo-lithographic Process for Making Microcups

The photo-lithographic method of making microcup arrays disclosed herein (e.g., as described in FIGS. 5A and 5B) may also be employed as the principle for a novel synchronized roll-to-roll photo-lithographic process. For the roll-to-roll process, the photomask may be synchronized with the substrate web and moved at the same speed as the latter, so as to permit a continuous production of the microcup array of the invention in the form of a continuous strip assembly.

In the preferred exemplary roll-to-roll process disclosed herein, the electrodes are disposed in orthogonal electrode lines ("ITO lines") which may be aligned with the microcups (i.e., the walls of the cups are aligned with the spaces between base ITO lines). Compartmentalization of the space by walls formed between the electrodes (the walls forming the micro-cup boundaries) facilitates pixelation and x-y addressing of the individual pixel (microcup). For x-y addressing of individual cup and hence pixel, the electrode lines will be orthogonal (i.e., the top electrode lines will be orthogonal to the base electrode lines). The micro-cups are therefore preferably positioned to be at the intersections of the perpendicular top and base ITO lines, when the microcup cell assembly process is complete (e.g., see FIG. 4). The base electrode or ITO lines is consequently deposited or embedded within the substrate web as a patterned series of parallel conductor lines prior to the microcup construction. The ITO lines are preferably of the same width as the micro-cups.

Addressable EPDs are known, and various techniques have been proposed to solve addressability problems, such as the threshold voltage problem, including the control electrode technique. See, e.g., B. Singer and A. L. Dalisa, Proc. SID, Vol. 18/3&4, $3^{rd}$ and $4^{th}$ Quarters, pp 255–266 (1977). It should be understood, however, that the synchronized roll-to-roll photo-lithographic process is inherently flexible, and may be employed to make EPD microcup arrays of a wide range of electrode configurations and electronic designs. Alternatively, for example, electronic components and/or conductors of various types may be embedded within the substrate web or overlain on either side of the web prior to supplying the web for the roll-to-roll process described herein and the subsequent formation of microcups upon the web. Likewise, such components may be applied or mounted to the underside of the web following formation of the microcups. Similarly, the microcup construction processes described herein may be employed to make cup-like compartments for displays and other devices in addition to EPD.

FIG. 8 illustrates an exemplary embodiment of the preferred roll-to-roll photo-lithographic production apparatus (80) of the invention for making the microcup array (81) for the electrophoretic display of the invention, and shows a cross-section through the apparatus (80) and a developing continuous strip microcup array (81). The microcup array may be prepared by imagewise exposing through a photomask (82) of radiation curable materials (84a) coated so as to cover the substrate web (86) and conductor film ITO lines (88). Known coating mechanisms may be used to apply the material (84a) to the web (86).

The curable material (84a) is preferably UV curable, and is cured by the UV radiation shown in FIG. 8 to form a stable, solid polymeric material (84b) where the UV passes through the mask (82) to be absorbed by the precursor material (84a).

The orientation of the device (80) in FIG. 8 is only exemplary, and the elements may be re-arranged in many suitable orientations with respect to the vertical direction for carrying out the method steps shown. Additional conventional supports, such as guides, rollers and the like, may be used to support, tension, turn, and/or twist the web (86) and microcup array (81) during the process shown.

The synchronized roll-to-roll process of the invention, as embodied in apparatus (80), includes mounting both photomask (82) and substrate web (86) in a manner that both are continuously movable and aligned adjacent one another, so that UV projection through the mask (82) and consequent curing of material (84a) may take place on a continuous and seamless manner.

In the preferred mounting arrangement shown in FIG. 8, the mask (82) is formed as a continuous loop, and is mounted to engage in tension at least a spaced-apart pair of drive/support cylinders (90) and (91), the mask loop (82) having a substantial straight section (92) spanning between the curved portions (93) which fit around the drive cylinders (90) and (91).

The continuous strip substrate web (86), upon which the microcup array (81) is constructed, similarly engages and passes around at least two spaced apart drive cylinders (100, 101), so that a straight portion (103) of the web (86) is aligned parallel to the straight section of the mask loop (82). The mask drive cylinders (90, 91) are driven to rotate in the direction shown as Arrows A, and the web drive cylinders (100, 101) are driven to rotate in the opposite direction shown as Arrows B, so as to cause the mask straight section (92) and web straight section (103) to move in parallel, in the same direction, at the same speed. The respective mask and web straight sections (92) and (103) respectively are preferably disposed a selected small distance apart, so as to prevent contamination of the mask (82) from the undeveloped material (84a).

In FIG. 8, the continuous web (86) is shown being fed inward (towards the UV exposure section) from the right-hand side, being supplied from a web storage/tensioner device (104) (not shown). Similarly, the developed web (with formed microcups) is shown being taken up by a second web storage/tensioner device (105) (not shown) as it moves outward (away from the UV exposure section). Devices (104 and 105) may comprise known web handling and drive mechanisms.

Alternatively to on-site coating of radiation curable materials (84a) onto the substrate web (86) and conductor film ITO lines (88), as shown in FIG. 8, a pre-coated web/ITO stock may be separately prepared and stored, e.g., in a roll form. The stored pre-coated web/ITO stock preferably is formulated to be dry and tack-free after drying, to improve storability. For this alternative, a higher process temperature may be used for the UV exposure step, than is typically used for on-site coated web (which may be tacky in its uncured state). The pre-coated stock may then be unrolled at point (104) and fed to drive cylinder (100).

Following UV exposure, the UV curable material (84a) is washed or developed with a suitable solvent which removes the uncured (non-exposed) material (84a) to leave the cured material (84b) in place, forming the walls of the microcups. The term "solvent" in this context refers to a suitable known means for selectively developing the material by removing the unexposed precursor, while leaving the exposed and cured photoresist in place. Known solvent application mechanisms may be employed.

Following the wash step, the developed material (84b) may be dried, and the completed microcup array (81) is taken up for storage or further processing (105).

FIG. 8A. shows in top view a portion of the mask (82). Note Line 8—8 in FIG. 8A defines the cross section of the mask (82) shown in main FIG. 8. The mask (82) comprises opaque sections (110) (generally square in this example), which are bounded by transparent mask sections (112).

FIG. 8B shows in plan view a portion of the developed microcup array (81). Note Line 8'—8' in FIG. 8B defines the cross section of the microcup array (81) shown in main FIG. 8. The exposed ITO conductor (88) in the microcup floor corresponds to the opaque mask portion (110), and the microcup walls (84b) correspond to the transparent mask portions (112).

The UV light shown in FIG. 8 irradiating the mask straight section (92) may be supplied from conventional sources (not shown). Optionally, the mask drive cylinders (90, 91) may comprise a UV transparent material, and a UV light source (not shown) may be located within either or both cylinders (90, 91) to provide additional illumination at the edges of mask straight section (92). Optionally, additional support rollers or guides (not shown) may be included to provide further support and alignment for mask straight section (92) and/or web straight section (103).

FIG. 8 shows a continuous coating step whereby the uncured precursor material (84a) is spread upon the web (86). Known coating mechanisms may be employed. Alternatively, the material (84a) may be applied in a separate operation, and pre-coated web substrate supplied from storage/tensioner (104).

The photomask (82) may be synchronized in motion with the web (86) to move at the same speed using conventional drive control mechanisms. For example, the drive cylinders (90, 91) may be mechanically coupled with drive cylinders (100, 101) (e.g., by gearing to a common drive motor) so that each rotates with the same tangential velocity. Alternatively, the drive cylinders may be controlled by conventional feedback circuitry to maintain coordinated motion, such as by sensors detecting the passage of ITO lines (88) on the web (86) and the passage of corresponding opaque sections (110) on the mask (92), for example by optical detectors (114) and (115) respectively. The detector signals may be used by the feedback control circuitry regulating drive speed to maintain positive alignment of these corresponding sections within the UV exposure sections (92/103). Alternative conventional sensor systems, such as magnetic sensors, bar code scanners/markings, and the like, may be employed to provide feed back synchronization control.

The thickness of the display produced by the present processes of the invention as described herein can be as thin as a piece of paper, and may be flexible.

The width of the display is preferably the width of the web (typically 3–90 inches). Alternatively, the microcup array may be cut to produce narrower displays, or one or more such microcup arrays may be mounted adjacent one another to produce wider displays.

The length of the display can be anywhere from inches to thousands of feet depending on the length of the web supply roll, since the roll-to-roll process can produce microcup arrays of any desired length.

Alternative Roll-to-Roll Methods

In addition to employing the method embodiment of FIG. 5, as shown in FIG. 8 (top exposure), the roll-to-roll apparatus of the invention may alternatively employ the methods of either of FIG. 6 or 7. For example, the method of FIG. 7 may be employed, whereby the web ((86) in FIG. 8) comprises a material transparent to the radiation. The conductor lines ((88) in FIG. 8) correspond to the conductors (72) in FIG. 7 are opaque to the radiation, and the web is irradiated from behind section (103) by an additional UV source (not shown).

Preparation and Sealing of Multi-Color Electrophoretic Displays

An important aspect of this invention is a method for selectively filling the micro-cups with pigment suspensions of different colors in a predetermined multicolor pattern to produce a color electrophoretic display. The steps for the manufacture of a multi-color electrophoretic display include:

(1) laminating or coating the formed microcup array with a positively working photoresist. Conventional photoresist compositions and developing solutions may be used, such as novolac photoresist from Shipley (MA) or Hunt Chemical (CT), or Sumitomo (Japan). For example, a laminating composition may be used comprising a removable support such as PET-4851 from Saint-Gobain, Worcester, Mass.; a novolac positive photoresist such as Microposit S1818 from Shipley; and an alkali-developable adhesive layer, such as a mixture of Nacor 72-8685 from National Starch and Carboset 515 from BF Goodrich;

(2) selectively opening a partial set (first subset) of the microcups by imagewise exposing the photoresist, removing the removable support film, and developing the positive photoresist with a developer such as diluted Microposit 351 developer from Shipley;

(3) filling the opened cups with the electrophoretic fluid, such as fluid containing charged white pigment ($TiO_2$) particles and dye or pigment of the first primary color;

(4) sealing the filled microcups as described in the preparation of monochrome displays; and (5) repeating steps (2) through (4) for additional subsets of the microcups, so as to create microcups filled with electrophoretic fluid of the second and the third primary colors.

Figure 9A:
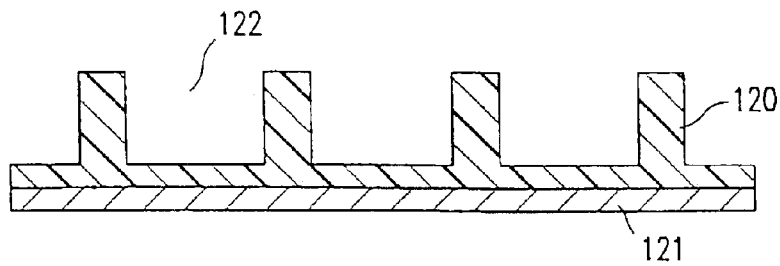
FIGS. 9A to 9H show an example of the preparation of a multi-color electrophoretic display by the method of the invention.

FIGS. 9A–9H show a specific example of the preparation of a multi-color electrophoretic display by the method of the invention, including the following steps:

FIG. 9A: Provide a microcup array produced by one of the methods described above, the microcup array comprising a plurality of dividing walls (120) mounted to web (121) to form an array of microcup cells (122).

Figure 9B:
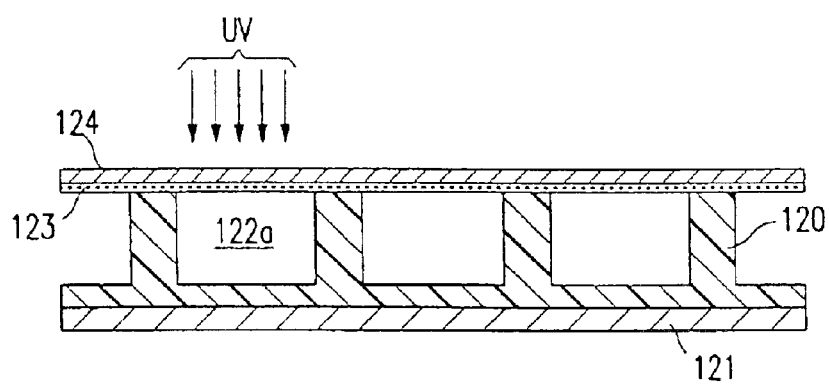

FIG. 9B: Laminate the array of microcups (122) with a positive dry-film photoresist which comprises at least an adhesive layer (123), and a positive photoresist (124). Using a first photomask (not shown), imagewise expose the positive photoresist (124) by UV, visible light, or other radiation, with the exposure being limited by the mask to a predetermined first subset of the microcups of the array (122*a*). Known photoresist compositions and laminating mechanisms may be employed.

Figure 9C:
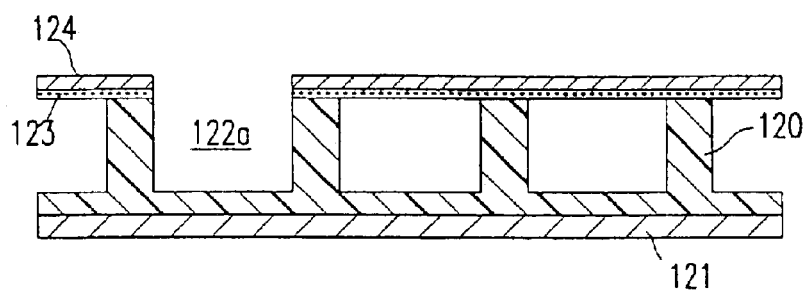

FIG. 9C: Develop the photoresist (124) so as to open by removal of the photoresist (124) and adhesive layer (123) from the selected exposed microcup subset (122*a*). Known photoresist development solvents and solvent application mechanisms may be employed.

Figure 9D:
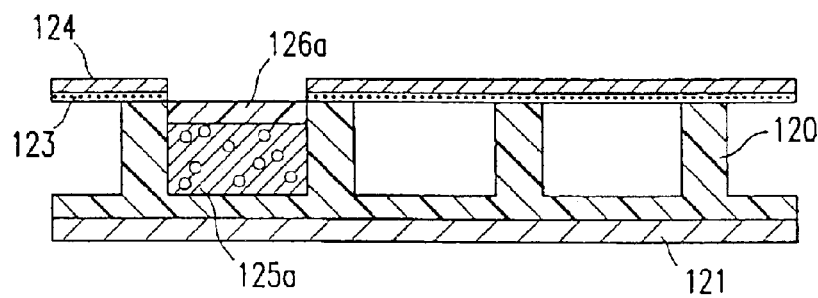

FIG. 9D: Fill in the opened microcup subset (122*a*) with a charged pigment dispersion (125*a*) in a dielectric solvent corresponding to the first primary color and a thermoset sealant precursor (126*a*) which is incompatible with the solvent and has a lower specific gravity than the solvent and the pigment particles. Seal the microcups (122*a*) of the first subset to form closed electrophoretic cells containing electrophoretic fluid of the first primary color by curing the thermoset precursor (126*a*) (preferably by radiation such as UV, less preferably by heat or moisture) during or after the thermoset precursor separates and forms a supernatant layer on top of the liquid phase. The sealing of the microcups may be alternatively accomplished by directly coating a layer of the thermoset precursor material over the surface of the liquid phase (125*a*).

Figure 9E:
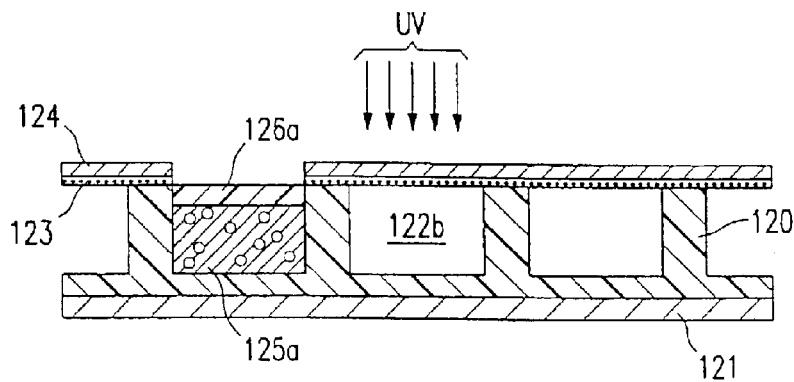

FIG. 9E: Repeat the steps shown in FIG. 9B with respect to a second selected subset (122*b*) of the microcups of the array, using a second mask to expose the second selected microcup subset (122*b*). Optionally, the first mask may be moved and re-aligned so as to expose the second subset.

Figure 9F:
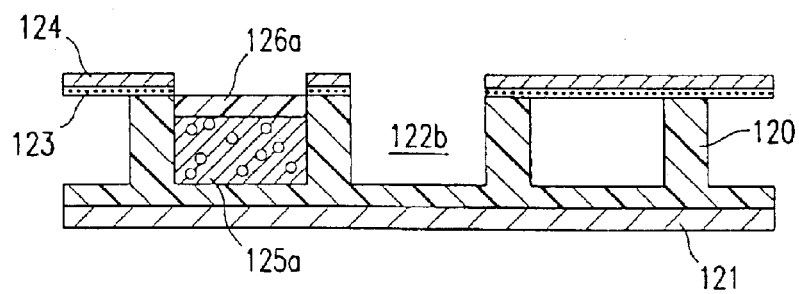

FIG. 9F: Repeat the steps shown in FIG. 9C with respect to the second selected subset (122*b*) of the microcups so as to open the second microcup subset (122*b*).

Figure 9G:
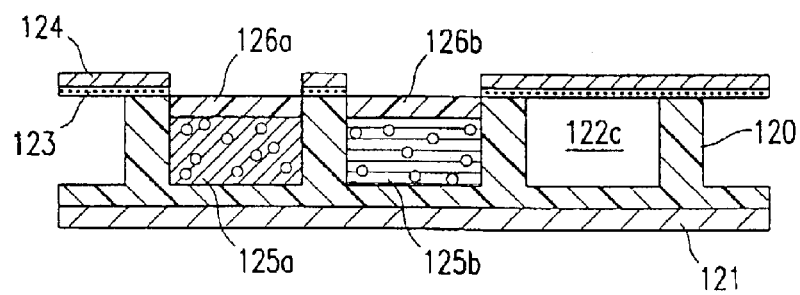

FIG. 9G: Repeat the steps shown in FIG. 9D with respect to the second selected subset (122*b*) of the microcups to fill the second microcup subset with a pigment/solvent dispersion (125*b*) corresponding to a second primary color, and to seal the second subset (122*b*) with sealant (126*b*) to form closed electrophoretic cells.

Figure 9H:
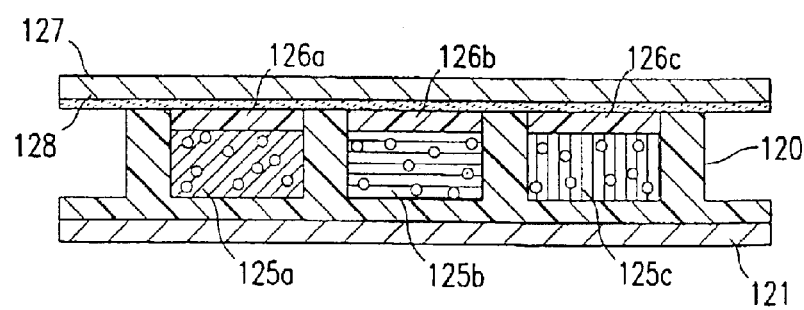

FIG. 9H: Repeat the steps shown in FIGS. 9B–D with respect to the third selected subset (122*c*) of the microcups so as to expose, open, fill and seal the third subset (122*c*) and form closed electrophoretic cells corresponding to a third primary color. The residual photoresist (124) and adhesive layer (123) may then be removed. The sealed array of electrophoretic cells is then laminated in registration to a pre-patterned transparent top conductor film (127) pre-coated with an adhesive layer (128) which may be a pressure sensitive adhesive, a hot melt adhesive, a heat, moisture, or radiation curable adhesive. The adhesive is hardened to bond to the cells. Known laminating mechanisms and adhesives may be employed.

Synchronized Roll-to-Roll Process for Multi-Color Electrophoretic Displays

An important aspect of this invention is a roll-to-roll method for making multi-color electrophoretic displays, whereby the process of FIGS. 9A–H may be carried out on a continuous basis. The method includes exposing the laminated or coated microcup array through a synchronized photomask that is registered with the microcups and moving at the same speed as the web carrying the laminated microcups. After exposing the selected cups, the positively working photoresist is developed and opened in the exposed areas. Color displays can then be manufactured by a semi-continuous process on a web of any desired length, which may be subdivided as desired for the final display product.

FIGS. 10, 10A and 10B show the method steps of FIGS. 9A–H carried out by the novel synchronized roll-to-roll photo-lithographic apparatus (130) of the invention using a positive acting photoresist laminate. The pre-formed microcup array/support web (81) is shown being fed inward at the upper right, such as from an array storage/tensioner device (105'), which may optionally be the output (105) of the roll-to-toll array forming process shown in FIG. 8.

The microcup array (81) is initially laminated or coated with a continuous strip of positive acting photoresist composition (131) which is fed inward from photoresist storage (132). In the case of lamination, the photoresist composition (131) may comprise the adhesive layer (123) and positive photoresist (124) shown in FIG. 9. The lamination may be accomplished by conventional laminating devices, such as by pressure of laminating cylinders (133a and 133b).

The roll-to-roll photo-lithographic apparatus (130) for making color displays is substantially similar to the roll-to-roll photo-lithographic apparatus (80) for making microcup arrays shown in FIG. 8. In the preferred mounting arrangement shown in FIG. 10, the mask (136) is formed as a continuous loop, and is mounted to engage in tension at least a spaced-apart pair of drive/support cylinders (140 and 141), the mask loop (136) having a substantial straight section (142) spanning between the curved portions (143) which fit around the drive cylinders (140 and 141).

The microcup array (81) similarly engages and passes around at least two spaced apart drive cylinders (150, 151), so that a straight portion (153) of the array (81) is aligned parallel to the straight section (142) of the mask loop (136). The mask drive cylinders (140, 141) are driven to rotate in the direction shown as Arrows A, and the web drive cylinders (150, 151) are driven to rotate in the opposite direction shown as Arrows B, so as to cause the mask straight section (142) and web straight section (153) to move in parallel, in the same direction, at the same speed. The respective mask and web straight sections (142) and (153) respectively are preferably disposed a selected small distance apart. The photomask (136) may be synchronized in motion with the microcup array (81) by the methods described above with respect to the roll-to-roll process of FIG. 8.

Note that the orientation of the device (130) in FIG. 10 is only exemplary, and the elements may be re-arranged in many suitable orientations with respect to the vertical direction for carrying out the method steps shown. Additional conventional supports, such as guides, rollers and the like, may be used to support, tension, turn, and/or twist the microcup array (81) during the process shown.

FIG. 10A shows in plan view a portion of the mask (136). Note Line 10—10 in FIG. 10A defines the cross section of the mask (136) shown in main FIG. 10. Note that the pattern of synchronized mask (136) has transparent sections (160) sized and aligned to permit the exposure of the surface (165) of a first subset of the microcups, in this example, every third microcup in linear sequence. The opaque portion of the mask (162) prevents exposure of the remaining microcups and wall area. Following UV or other radiation exposure, the photoresist (131) is washed or treated with a suitable photoresist developer which leaves the unexposed material (131a) in place as it removes the exposed material (131b), so as to create an opening in the laminate of the exposed microcups. Following the wash step, the microcup array may be dried, and the microcup array is taken up for storage or further processing (106).

FIG. 10B shows in plan view a portion of the microcup array (81) following development of the photoresist (131). Note Line 10'—10' in FIG. 10B defines the cross section of the microcup array (81) shown in main FIG. 10. The exposed ITO conductor (88) in the microcup floor corresponds to the transparent mask portion (160), as the exposed conductor (88) of a subset of the microcups is visible through the openings (166) formed by removal of exposed photoresist (131b). The balance of the microcups and walls remain covered by unexposed photoresist (131a), corresponding to the transparent mask portions (162). In the example of FIG. 10, the first microcup subset, both in transparent mask sections (160) and developed photoresist openings (166), comprises staggered-offset rows, with every third microcup in each row opened.

In FIG. 10, the microcup array (81) with the first subset openings (166) is shown being taken up by a second array storage/tensioner device (106) (not shown) as it moves outward (away from the UV exposure section). Optionally, the device (106) may comprise further processing apparatus for continuous processing. It may be seen that following filling and sealing the opened microcups, as described above with respect to FIG. 9D, the process of FIG. 10 may be repeated (on the same or additional device (130), with the transparent sections (160) of mask (136) aligned to expose and create openings in a second microcup subset.

Figure 11:
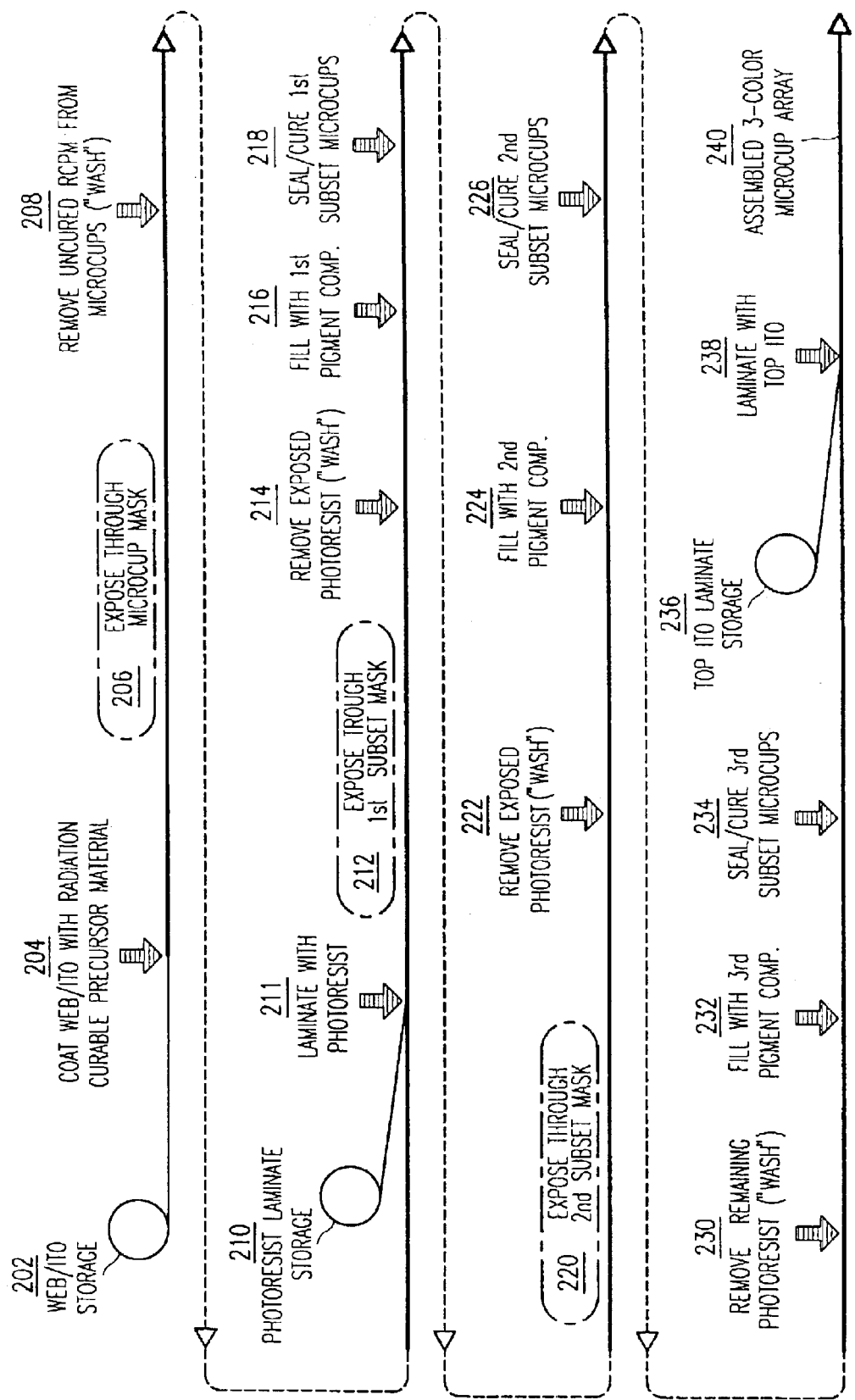
FIG. 11 illustrates schematically an exemplary semi-continuous process for the preparation of a 3-color EPD microcup array assembly.

FIG. 11 illustrates schematically a semi-continuous process for the manufacture of a 3-color EPD microcup array assembly, employing the methods described herein, particularly the methods described above in FIGS. 8, 9 and 10. The exemplary process of FIG. 11 begins with the in-feed of a pre-patterned conductor/support web from a web storage device (202). The web forms a continuous strip substrate upon which the processes of steps (204) through (238) of FIG. 11 may be performed in sequence. The web may be moved, turned and guided by rollers, guide slots and the like, (not shown) as needed to bring it sequentially to the locations of apparatus to perform these steps.

At step (204), the web/conductor is coated with radiation curable precursor material (RCPM). At step (206), the coated web is exposed in a roll-to-roll synchronized photo-lithographic apparatus of the invention through a microcup mask. At step (208), the uncured RCPM is removed by treatment or "washing" employing suitable solvent compositions, to leave the cured microcup array formed upon the web.

A positive acting photoresist laminate or coating is fed from storage device (210) and laminated or coated onto the upper surface of the microcup array at step (211), thereby individually enclosing the microcups, so as to permit selective filling. The microcup array with the photoresist is then exposed in another roll-to-roll synchronized photo-lithographic apparatus of the invention at step (212), using a mask configured to only expose a first subset of the microcups. At step (214), the microcup array is treated or "washed" employing suitable solvent compositions, to remove the exposed portion of the photoresist. Since Step (212) only exposed the first subset of microcups, the removal of the photoresist is only from the tops of the first subset of microcups, which are thereby selectively opened. At step (216), the opened first subset of cups are filled with a first pigment/solvent composition. At step (218), the first subset of open microcups is sealed and cured as described in FIG. 9 above. The sealing process of step (218) does not compromise the unexposed photoresist.

The microcup array is then exposed in another roll-to-roll synchronized photo-lithographic apparatus of the invention at step (220) using a mask configured to expose a second subset of the microcups (while leaving a remaining third subset unexposed). At step (222), the microcup array is treated or "washed" employing suitable solvent compositions, to remove the exposed portion of the photoresist. Since Step (220) only exposed the second subset of microcups, the removal of the photoresist is only from the tops of this second subset, which are thereby selectively opened (leaving the third subset closed). At step (224), the opened second subset of cups are filled with a second pigment/solvent composition. At step (226), the second subset of open microcups is sealed and cured as described at step (218).

The remaining photoresist is then removed at step (230), the microcup array being treated or "washed" employing suitable solvent compositions, thereby opening the third subset of microcups. Optionally, step (230) may include exposing the remaining photoresist to radiation, to assist removal. At step (232), the opened third subset of cups are filled with a third pigment/solvent composition. At step (234), the third subset of open microcups is sealed and cured as described at step (218).

At step (238), a pre-patterned ITO top conductor film is fed from ITO laminated storage device (236) and is laminated to the upper surface of the filled and sealed microcup array. The exemplary process terminates with the out-feed of an assembled 3-color EPD microcup array (240) in the form of a continuous sealed EPD array strip. The microcup array (240) may be out-fed to storage, or may continue to further continuous sequence processing steps. In general, further processing includes subdividing the array to form individual array portions, which are subsequently packaged to form EPD products.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, materials, compositions, processes, process step or steps, to the objective, spirit and scope of the present invention. All such modifications are intended to be within the scope of the claims appended hereto.

For example, it should be noted that the method of the invention for making microcups may also be used for manufacturing microcup arrays for liquid crystal displays, as well as electrophoretic displays. Similarly, the microcup selective filling, sealing and ITO laminating methods of the invention may also be employed in the manufacture of liquid crystal displays.

It is therefore wished that this invention to be defined by the scope of the appended claims as broadly as the prior art will permit, and in view of the specification if need be.

What is claimed is:

1. An apparatus comprising:
    (a) a web drive mechanism engaging a support web to movably guide said support web wherein said support web is coated with a layer of a radiation curable material;
    (b) a photomask loop which comprises a pattern corresponding in form to said well-defined structures for selective imagewise exposure of said radiation curable material;
    (c) a photomask alignment mechanism capable of aligning at least a portion of said photomask loop in generally parallel orientation to at least a portion of said support web;
    (d) a photomask drive mechanism to move at least a portion of said photomask loop and at least a portion of said support web in parallel in substantially the same direction;
    (e) a radiation source mounted in cooperative alignment with said photomask loop and said support web to allow passage of radiation through a portion of said photomask loop directly onto said radiation curable material coated on a portion of said support web, which is in generally parallel orientation with said portion of said photomask loop through which the radiation passes, for selective imagewise exposure of said radiation curable material; and
    (f) a solvent application mechanism for the application of at least a solvent for removing unexposed portion of said radiation curable material.

2. The apparatus of claim 1, wherein at least a portion of said photomask loop and at least a portion of said support web are moving at substantially the same speed.

3. The apparatus of claim 1, wherein said well-defined structures are microcups and
    (a) said support web comprises a plurality of conductor lines for addressing said microcups; and
    (b) said pattern of said photomask loop corresponds in form to said microcups for direct and selective imagewise exposure of at least a portion of said radiation curable material and leaving at least another portion of said radiation curable material unexposed.

4. The apparatus of claim 3, wherein the conductor lines are transparent to visible light.

5. An apparatus comprising:
    (a) a web drive mechanism engaging a support web to movably guide said support web wherein said support web comprises a plurality of pre-formed microcups disposed thereon and each of said pre-formed microcups has a top opening;
    (b) a layer of positively working photoresist deposited on said microcups to close said top openings;
    (c) a photomask loop having a pattern corresponding in form to the top openings of a first pre-selected subset of microcups for selective imagewise exposure of the positively working resist;
    (d) a photomask alignment mechanism mounted adjacent said support web to align at least a portion of said support web in generally parallel orientation to at least a portion of said photomask loop;
    (e) a photomask drive mechanism to move at least a portion of said photomask loop and at least a portion of said support web in parallel in substantially the same direction;
    (f) a radiation source mounted in cooperative alignment with said photomask loop and said support web to allow passage of radiation through a portion of said photomask loop directly onto said positively working photoresist deposited on said microcups which are disposed on a portion of said support web, which portion of said support web is in generally parallel orientation with said portion of said photomask loop through which the radiation passes, for selective imagewise exposure of a portion of said positively working photoresist and leaving at least another portion of said positively working photoresist unexposed; and
    (g) a solvent application mechanism for application of at least a solvent for removing said exposed positively working photoresist to reopen the top openings of the first pre-selected subset of microcups.

6. The apparatus of claim 5, further comprising:

(a) a filling mechanism mounted adjacent said support web for filling said reopened first pre-selected subset of microcups with a first display composition; and (b) a sealing mechanism mounted adjacent said support web for only sealing of said filled first pre-selected subset of microcups.

7. The apparatus of claim 6, further comprising a laminating mechanism mounted adjacent said support web for the lamination of a top laminate over sealed microcups, said top laminate comprises a plurality of conductor lines for addressing the microcups.

8. The apparatus of claim 7, wherein the conductor lines are transparent to visible light.

9. The apparatus of claim 6, wherein said first display composition is an electrophoretic display composition or a liquid crystal display composition.

* * * * *